(12) United States Patent
Song et al.

(10) Patent No.: US 11,688,478 B2
(45) Date of Patent: Jun. 27, 2023

(54) NONVOLATILE MEMORY DEVICE WITH CAPABILITY OF DETERMINING DEGRADATION OF DATA ERASE CHARACTERISTICS

(71) Applicant: Samsung Electronics Co., Ltd., Suwon-si (KR)

(72) Inventors: Seong-Jin Song, Suwon-si (KR); Hyun-Wook Park, Hwaseong-si (KR); Bong-Soon Lim, Seoul (KR); Do-Bin Kim, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 17/694,229

(22) Filed: Mar. 14, 2022

(65) Prior Publication Data
US 2022/0199174 A1    Jun. 23, 2022

Related U.S. Application Data

(63) Continuation of application No. 17/021,407, filed on Sep. 15, 2020, now Pat. No. 11,289,170, which is a
(Continued)

(30) Foreign Application Priority Data

Jun. 1, 2018  (KR) .......................... 10-2018-0063474

(51) Int. Cl.
*G11C 16/34*    (2006.01)
*G11C 16/04*    (2006.01)
(Continued)

(52) U.S. Cl.
CPC ........ *G11C 16/349* (2013.01); *G11C 16/0483* (2013.01); *G11C 16/14* (2013.01);
(Continued)

(58) Field of Classification Search
CPC ... G11C 16/349; G11C 16/0483; G11C 16/14; G11C 16/16; H01L 24/05; H01L 24/08;
(Continued)

(56) References Cited

U.S. PATENT DOCUMENTS 5,978,276 A    11/1999  Wong
8,203,885 B2    6/2012  Abiko et al.
(Continued)

FOREIGN PATENT DOCUMENTS

KR    1020150072185 A    6/2015

*Primary Examiner* — Sultana Begum
(74) *Attorney, Agent, or Firm* — Muir Patent Law, PLLC

(57) ABSTRACT

A nonvolatile memory device includes a memory cell region and a peripheral circuit region. The memory cell region includes a memory block, and the peripheral circuit region includes a control circuit. The memory cell region includes a first metal pad. The peripheral circuit region includes a second metal pad and is vertically connected to the memory cell region by the first metal pad and the second metal pad. The memory block includes a plurality of memory cells disposed in a vertical direction. The control circuit determines whether a data erase characteristic for the memory block is degraded for each predetermined cycle of data erase operation, and performs a data erase operation by changing a level of a voltage applied to selection transistors for selecting the memory block as an erase target block when it is determined that the data erase characteristic is degraded.

20 Claims, 31 Drawing Sheets

Related U.S. Application Data continuation-in-part of application No. 16/226,810, filed on Dec. 20, 2018, now Pat. No. 10,825,530.

(51) Int. Cl.

| | | |
|---|---|---|
| *G11C 16/14* | (2006.01) | |
| *H01L 25/065* | (2023.01) | |
| *H01L 25/18* | (2023.01) | |
| *H01L 23/00* | (2006.01) | |

(52) U.S. Cl.
CPC .............. *H01L 24/05* (2013.01); *H01L 24/08* (2013.01); *H01L 25/0657* (2013.01); *H01L 25/18* (2013.01); *H01L 2224/05147* (2013.01); *H01L 2224/08145* (2013.01); *H01L 2924/1431* (2013.01); *H01L 2924/14511* (2013.01)

(58) Field of Classification Search
CPC .................. H01L 25/0657; H01L 25/18; H01L 2224/05147; H01L 2224/08145; H01L 2924/1431; H01L 2924/14511; H01L 27/11556; H01L 27/11582; H01L 24/94; H01L 2224/05624; H01L 2224/05647; H01L 2224/05684; H01L 2224/09181; H01L 2224/09517; H01L 2224/80895; H01L 2224/94; H01L 2225/06527; H01L 2225/06544

See application file for complete search history.

(56) References Cited

U.S. PATENT DOCUMENTS

| | | |
|---|---|---|
| 8,605,508 B2 | 12/2013 | Itagaki et al. |
| 8,885,412 B2 | 11/2014 | Li et al. |
| 8,891,308 B1 | 11/2014 | Ou et al. |
| 9,019,775 B2 | 4/2015 | Costa et al. |
| 9,263,143 B2 | 2/2016 | Hsu et al. |
| 9,548,123 B2 | 1/2017 | Choe et al. |
| 2009/0021988 A1 | 1/2009 | Hong et al. |
| 2009/0073797 A1 | 3/2009 | Song et al. |
| 2010/0290292 A1 | 11/2010 | Tanizaki et al. |
| 2012/0269001 A1 | 10/2012 | Ueno et al. |
| 2013/0054881 A1 | 2/2013 | Ellis et al. |
| 2015/0179235 A1 | 6/2015 | Nam |
| 2016/0086967 A1 | 3/2016 | Lee et al. |
| 2016/0343450 A1 | 11/2016 | Lee et al. |
| 2018/0130535 A1 | 5/2018 | Lee |
| 2019/0051362 A1 | 2/2019 | Lee |
| 2021/0012840 A1 | 1/2021 | Shim et al. |

NONVOLATILE MEMORY DEVICE WITH CAPABILITY OF DETERMINING DEGRADATION OF DATA ERASE CHARACTERISTICS

CROSS-REFERENCE TO RELATED APPLICATION

This application is a continuation of U.S. application Ser. No. 17/021,407 filed on Sep. 15, 2020, which is a continuation-in-part (CIP) application of U.S. patent application Ser. No. 16/226,810, filed on Dec. 20, 2018, which claims priority under 35 USC § 119 to Korean Patent Application No. 10-2018-0063474, filed on Jun. 1, 2018 in the Korean Intellectual Property Office (KIPO), the contents of which are herein incorporated by reference in their entirety.

BACKGROUND

1. Technical Field

Example embodiments relate generally to semiconductor memory devices, and more particularly to methods of erasing data in nonvolatile memory devices and nonvolatile memory devices performing the methods.

2. Description of the Related Art

Semiconductor memory devices can generally be divided into two categories depending upon whether or not they retain stored data when disconnected from a power supply. These categories include volatile memory devices, which lose stored data when disconnected from power, and nonvolatile memory devices, which retain stored data when disconnected from power. Volatile memory devices may perform read and write operations at a high speed, while contents stored therein may be lost at power-off. Nonvolatile memory devices may retain contents stored therein even at power-off, which means they may be used to store data that must be retained regardless of whether they are powered. Recently, semiconductor memory devices having memory cells that are stacked "vertically" (i.e., in three dimensions (3D)) have been researched to improve the capacity and integration density of the semiconductor memory devices.

SUMMARY

At least one example embodiment of the present disclosure provides a method of erasing data in a nonvolatile memory device that includes memory cells stacked in three dimensions capable of improving characteristics and reliability of a data erase operation.

At least one example embodiment of the present disclosure provides a nonvolatile memory device performing the method of erasing data.

According to example embodiments, a nonvolatile memory device includes a memory cell region, a peripheral circuit region. The memory cell region includes a memory block, and the peripheral circuit region includes a control circuit. The memory cell region includes a first metal pad. The peripheral circuit region includes a second metal pad and is vertically connected to the memory cell region by the first metal pad and the second metal pad. The memory block includes a plurality of memory cells disposed in a vertical direction. The control circuit determines whether a data erase characteristic for the memory block is degraded for each predetermined cycle of data erase operation, and performs a data erase operation by changing a level of a voltage applied to selection transistors for selecting the memory block as an erase target block when it is determined that the data erase characteristic is degraded.

According to example embodiments, a nonvolatile memory device includes a memory cell region and a peripheral circuit region. The memory cell region includes a memory block, and the peripheral circuit region includes a control circuit. The memory cell region includes a first metal pad. The peripheral circuit region includes a second metal pad and is vertically connected to the memory cell region by the first metal pad and the second metal pad. The memory block includes a plurality of memory cells disposed in a vertical direction. The control circuit determines whether a data erase characteristic for the memory block is degraded for each predetermined cycle of data erase operation, and performs a data erase operation by changing an amount of time during which a voltage is applied to selection transistors for selecting the memory block as an erase target block when it is determined that the data erase characteristic is degraded.

In the method of erasing data according to example embodiments and the nonvolatile memory device according to example embodiments, the data erase operation may be performed based on at least one of the first change operation and the second change operation when it is determined that the data erase characteristic is degraded. The first change operation may represent an operation of changing the level of the voltage applied to the selection transistors, and the second change operation may represent an operation of changing the time during which the voltage is applied to the selection transistors. Thus, the characteristic and reliability of the data erase operation may be improved or enhanced, and the nonvolatile memory device may have relatively extended lifetime.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
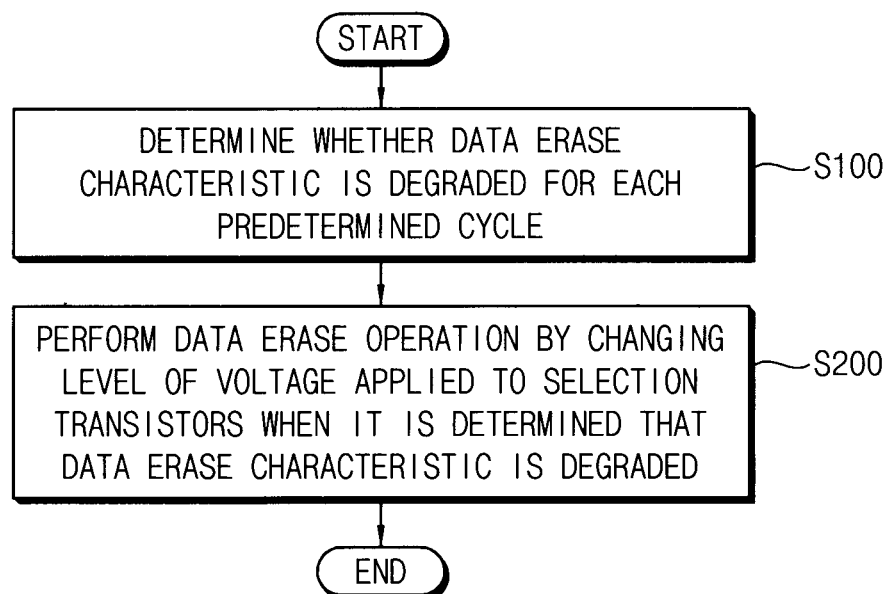
FIG. 1 is a flow chart illustrating a method of erasing data in a nonvolatile memory device according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

Figure 2:
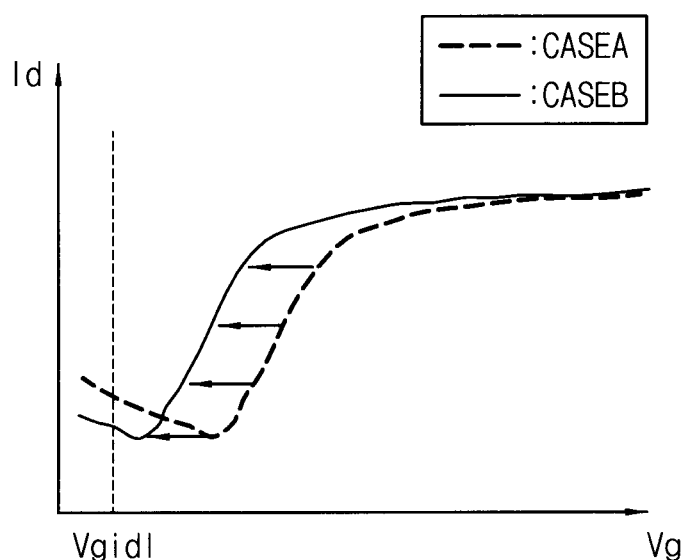
FIGS. 2, 3A and 3B are diagrams for describing a method of erasing data in a nonvolatile memory device according to example embodiments.
Figure 3A:
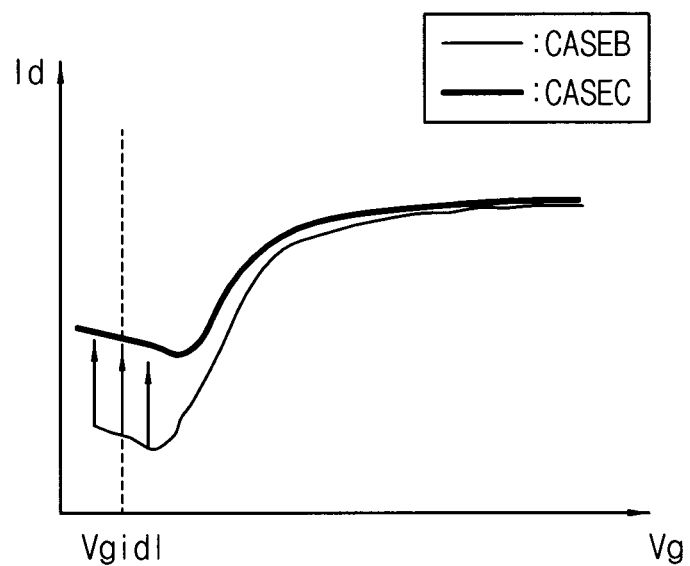
Figure 3B:
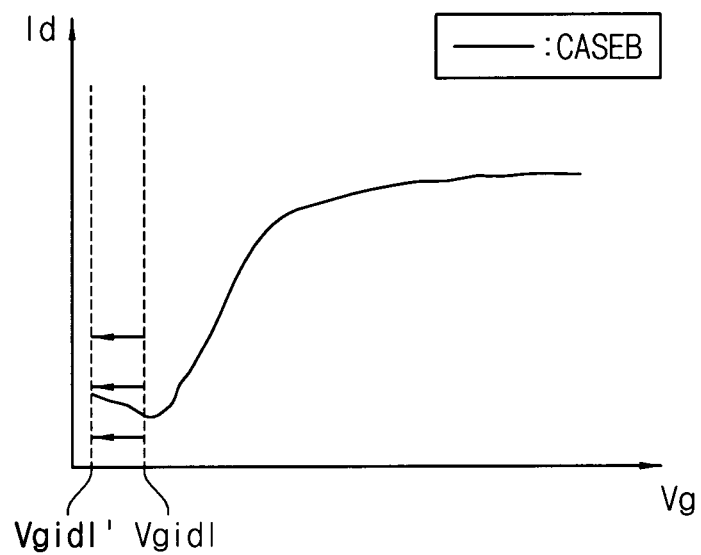

FIG. 1 is a flow chart illustrating a method of erasing data in a nonvolatile memory device according to example embodiments. FIGS. 2, 3A and 3B are diagrams for describing a method of erasing data in a nonvolatile memory device according to example embodiments.

Referring to FIGS. 1, 2, 3A and 3B, a method of erasing data according to example embodiments is performed by a nonvolatile memory device including one or more memory blocks, and a plurality of memory cells are disposed in a vertical direction within each memory block. For example, each memory block includes a plurality of memory cells that are stacked in the vertical direction (i.e., substantially perpendicular to) relative to a surface (i.e., upper surface) of a substrate. Configurations of the nonvolatile memory device and the memory block will be described in detail with reference to FIGS. 4 through 6.

Terms such as "substantially," "about," or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In the method of erasing data in the nonvolatile memory device according to example embodiments, it is determined whether a data erase characteristic for the memory block is degraded or not for each predetermined cycle (step S100). When it is determined that the data erase characteristic is degraded or deteriorated, a data erase operation is performed by changing a level of a voltage applied to selection transistors for selecting the memory block as an erase target block (step S200).

The data erase operation may be performed based on gate induced drain leakage (GIDL) scheme. For example, a relatively high voltage may be applied to first electrodes (e.g., drain electrodes) of the selection transistors and a relatively low voltage may be applied to control electrodes (e.g., gate electrodes) of the selection transistors, thereby causing a GIDL phenomenon (e.g., a GIDL current) to occur for the data erase operation. The selection transistors may be referred to as GIDL injection transistors.

The degradation or deterioration of the data erase characteristic may indicate that a characteristic of the GIDL injection transistors is degraded or deteriorated. For example, the degradation or deterioration of the characteristic of the GIDL injection transistors may indicate that threshold voltages of the GIDL injection transistors decrease. When the threshold voltages of the GIDL injection transistors decrease, an I-V curve of the GIDL injection transistors may be changed from CASEA to CASEB as illustrated in FIG. 2. In this case, a current Id (e.g., the GIDL current) at the drain electrodes of the GIDL injection transistors may decrease (e.g., CASEB as illustrated in FIG. 2) even if a voltage Vg at the gate electrodes of the GIDL injection transistors is maintained to the same level (e.g., a level Vgidl). For example, when the threshold voltages of the GIDL injection transistors decrease, the amount of the GIDL current may decrease under the same voltage condition, and thus the data erase operation may not be normally performed.

In step S200 of performing the data erase operation according to example embodiments, the amount of the GIDL current may be controlled or adjusted by changing the level of the voltage applied to the selection transistors without structural modification (e.g., the amount of the GIDL current may be controlled or adjusted based on the change in the voltage for the GIDL injection transistors), thereby improving or enhancing the characteristic and reliability of the data erase operation.

In some example embodiments, the amount of the GIDL current may be controlled by adjusting voltage differences between the drain electrodes and the gate electrodes of the selection transistors (e.g., the GIDL injection transistors). For example, the amount of the GIDL current may increase as the voltage differences between the drain electrodes and the gate electrodes of the selection transistors increase from a predetermined threshold value. Alternatively, the amount of the GIDL current may decrease as the voltage differences between the drain electrodes and the gate electrodes of the selection transistors decrease from the predetermined threshold value.

For example, when a voltage at the drain electrodes of GIDL injection transistors increases, an I-V curve of the GIDL injection transistors may be changed from CASEB to CASEC as illustrated in FIG. 3A. In this example, the current Id at the drain electrodes of the GIDL injection transistors may increase even if the voltage Vg at the gate electrodes of the GIDL injection transistors is maintained to the same level (e.g., the level Vgidl), and thus the amount of the GIDL current may increase. In addition, when the voltage at the gate electrodes of the GIDL injection transistors decreases, e.g., when the voltage Vg at the gate electrodes of the GIDL injection transistors decreases from Vgidl to Vgidl' as illustrated in FIG. 3B, the current Id at the drain electrodes of the GIDL injection transistors may increase, and thus the amount of the GIDL current may increase. Additionally, when the voltage at the drain electrodes of GIDL injection transistors increases and the voltage at the gate electrodes of the GIDL injection transistors decreases together, the amount of the GIDL current may increase. Detailed operations of controlling the voltage differences between the drain electrodes and the gate electrodes of the GIDL injection transistors will be described with reference to FIGS. 7 through 16.

In some example embodiments, the predetermined cycle for determining whether the data erase characteristic is degraded may be associated with the number of cycles of the data erase operation (e.g., the number of program/erase (P/E) cycles that were performed). The data erase characteristic may be more severely degraded (e.g., the threshold voltages of the GIDL injection transistors may be more reduced) as the number of cycles of the data erase operation increases, and thus it may be determined whether the data erase characteristic is degraded whenever the data erase operation is performed every I times where I is a natural number greater than or equal to two. For example, if I=100, it may be determined whether the data erase characteristic is degraded whenever the data erase operation is performed 100, 200, 300, . . . times.

In other example embodiments, the predetermined cycle for determining whether the data erase characteristic is degraded may be associated with an operating temperature and/or operating time of the nonvolatile memory device. The data erase characteristic may be more severely degraded (e.g., the threshold voltages of the GIDL injection transistors may be more reduced) in a low-temperature environment in which the operating temperature is lower than a first reference temperature or a high-temperature environment in which the operating temperature is higher than a second reference temperature, and thus it may be determined whether the data erase characteristic is degraded whenever the operating time of the nonvolatile memory device in the low-temperature environment or the high-temperature environment exceeds every J hours where J is a positive real number.

In still other example embodiments, the predetermined cycle for determining whether the data erase characteristic is degraded may be associated with at least one of various factors causing the degradation of the data erase characteristic.

In some example embodiments, the method of erasing data in the nonvolatile memory device may be performed based on a command and an address for the data erase operation (e.g., when the command and the address for the data erase operation are received).

Figure 4:
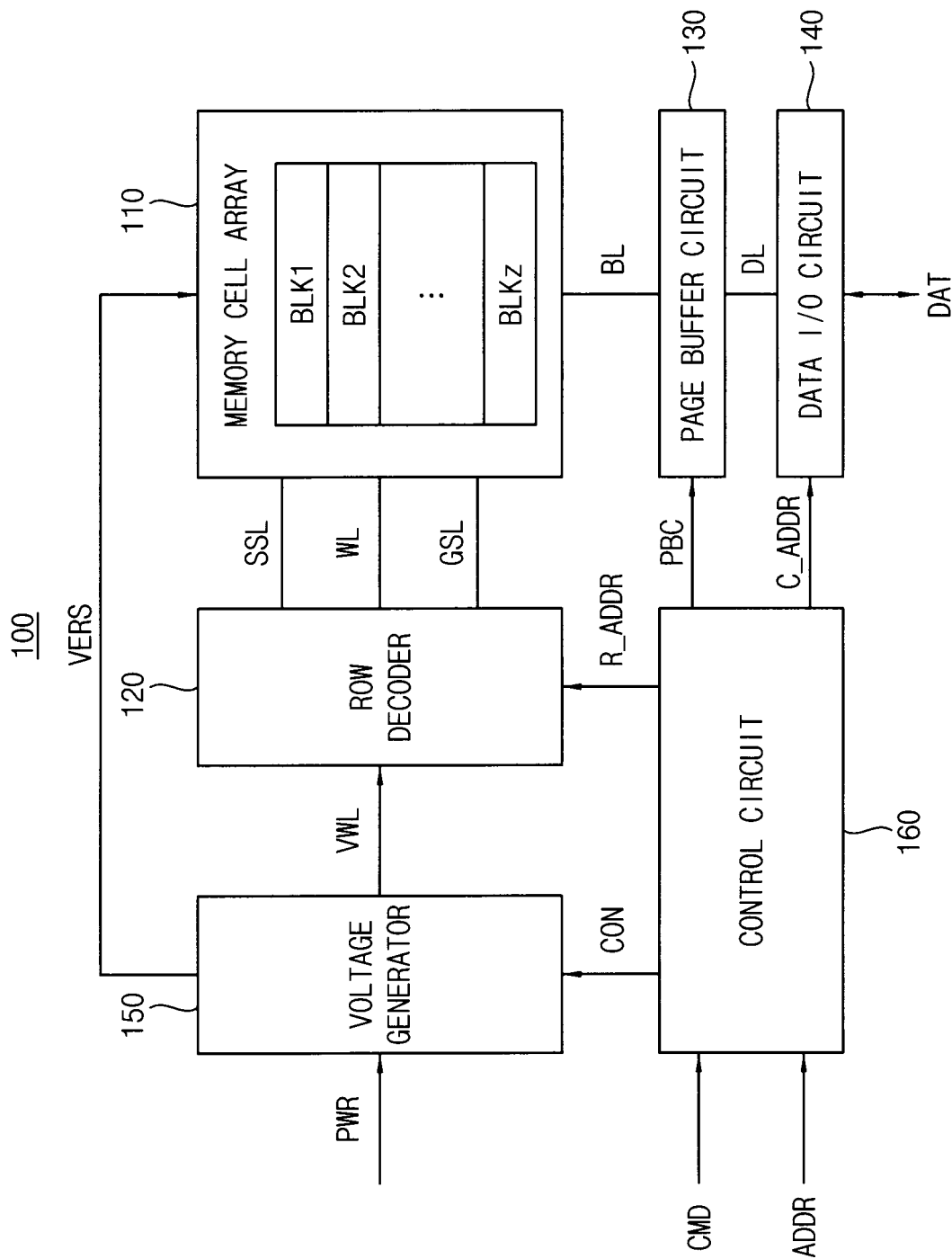
FIG. 4 is a block diagram illustrating a nonvolatile memory device according to example embodiments.

FIG. 4 is a block diagram illustrating a nonvolatile memory device according to example embodiments.

Referring to FIG. 4, a nonvolatile memory device 100 includes a memory cell array 110, a row decoder 120, a page buffer circuit 130, a data input/output (I/O) circuit 140, a voltage generator 150 and a control circuit 160.

The memory cell array 110 is connected to the row decoder 120 via a plurality of string selection lines SSL, a plurality of wordlines WL and a plurality of ground selection lines GSL. The memory cell array 110 is further connected to the page buffer circuit 130 via a plurality of bitlines BL. The memory cell array 110 may include a plurality of memory cells (e.g., a plurality of nonvolatile memory cells) that are connected to the plurality of wordlines WL and the plurality of bitlines BL. The memory cell array 110 may be divided into a plurality of memory blocks BLK1, BLK2, . . . , BLKz, each of which includes corresponding memory cells.

In some example embodiments, as will be described with reference to FIGS. 5 and 6, the memory cell array 110 may be a three-dimensional memory cell array, which is formed on a substrate in a three-dimensional structure (or a vertical structure). In this example, the memory cell array 110 may include a plurality of cell strings (e.g., a plurality of vertical NAND strings) that are vertically oriented such that at least one memory cell is located over another memory cell.

The control circuit 160 receives a command CMD and an address ADDR from a memory controller (e.g., a memory controller 600 in FIG. 30), and control erasure, programming and read operations of the nonvolatile memory device 100 based on the command CMD and the address ADDR. An erasure operation may include performing a sequence of erase loops, and a programming operation may include performing a sequence of program loops. Each erase loop may include an erase operation and an erase verification operation. Each program loop may include a program operation and a program verification operation. The read operation may include a normal read operation and data recover read operation.

For example, the control circuit 160 may generate control signals CON, which are used for controlling the voltage generator 150, and may generate control signal PBC for controlling the page buffer circuit 130, based on the command CMD, and may generate a row address R_ADDR and a column address C_ADDR based on the address ADDR. The control circuit 160 may provide the row address R_ADDR to the row decoder 120 and may provide the column address C_ADDR to the data I/O circuit 140.

In addition, the control circuit 160 controls the row decoder 120, the page buffer circuit 130, the data I/O circuit 140 and the voltage generator 150 based on the command CMD and the address ADDR to perform the method of erasing data in the nonvolatile memory device 100 according to example embodiments (e.g., the method of FIG. 1, etc.).

The row decoder 120 may be connected to the memory cell array 110 via the plurality of string selection lines SSL, the plurality of wordlines WL and the plurality of ground selection lines GSL.

For example, in the data erase/write/read operations, the row decoder 120 may determine at least one of the plurality of wordlines WL as a selected wordline, and may determine the rest or remainder of the plurality of wordlines WL other than the selected wordline as unselected wordlines, based on the row address R_ADDR.

In addition, in the data erase/write/read operations, the row decoder 120 may determine at least one of the plurality of string selection lines SSL as a selected string selection line, and may determine the rest or remainder of the plurality of string selection lines SSL other than the selected string selection line as unselected string selection lines, based on the row address R_ADDR.

Furthermore, in the data erase/write/read operations, the row decoder 120 may determine at least one of the plurality of ground selection lines GSL as a selected ground selection line, and may determine the rest or remainder of the plurality of ground selection lines GSL other than the selected ground selection line as unselected ground selection lines, based on the row address R_ADDR.

The voltage generator 150 may generate wordline voltages VWL that are required for an operation of the nonvolatile memory device 100 based on a power PWR and the control signals CON. The wordline voltages VWL may be applied to the plurality of string selection lines SSL, the plurality of wordlines WL and the plurality of ground selection lines GSL via the row decoder 120. In addition, the voltage generator 150 may generate an erase voltage VERS that is required for the data erase operation based on the power PWR and the control signals CON.

For example, during the erase operation, the voltage generator 150 may apply the erase voltage VERS to a common source line and/or the bitlines BL of a memory block (e.g., a selected memory block) and may apply an erase permission voltage (e.g., a ground voltage) to all wordlines of the memory block or a portion of the wordlines via the row decoder 120. In addition, during the erase verification operation, the voltage generator 150 may apply an erase verification voltage simultaneously to all wordlines of the memory block or sequentially to the wordlines one by one.

For example, during the program operation, the voltage generator 150 may apply a program voltage to the selected wordline and may apply a program pass voltage to the unselected wordlines via the row decoder 120. In addition, during the program verification operation, the voltage generator 150 may apply a program verification voltage to the selected wordline and may apply a verification pass voltage to the unselected wordlines via the row decoder 120.

In addition, during the normal read operation, the voltage generator 150 may apply a read voltage to the selected wordline and may apply a read pass voltage to the unselected wordlines via the row decoder 120. During the data recover read operation, the voltage generator 150 may apply the read voltage to a wordline adjacent to the selected wordline and may apply a recover read voltage to the selected wordline via the row decoder 120.

The page buffer circuit 130 may be connected to the memory cell array 110 via the plurality of bitlines BL. The page buffer circuit 130 may include a plurality of page buffers. In some example embodiments, each page buffer may be connected to one bitline. In other example embodiments, each page buffer may be connected to two or more bitlines.

The page buffer circuit 130 may store data DAT to be programmed into the memory cell array 110 or may read data DAT sensed from the memory cell array 110. For example, the page buffer circuit 130 may operate as a write driver or a sensing amplifier according to an operation mode of the nonvolatile memory device 100.

The data I/O circuit 140 may be connected to the page buffer circuit 130 via data lines DL. The data I/O circuit 140 may provide the data DAT from an outside of the nonvolatile memory device 100 (e.g., from the memory controller 600 in FIG. 30) to the memory cell array 110 via the page buffer circuit 130 or may provide the data DAT from the memory cell array 110 to the outside of the nonvolatile memory device 100, based on the column address C_ADDR.

Figure 5:
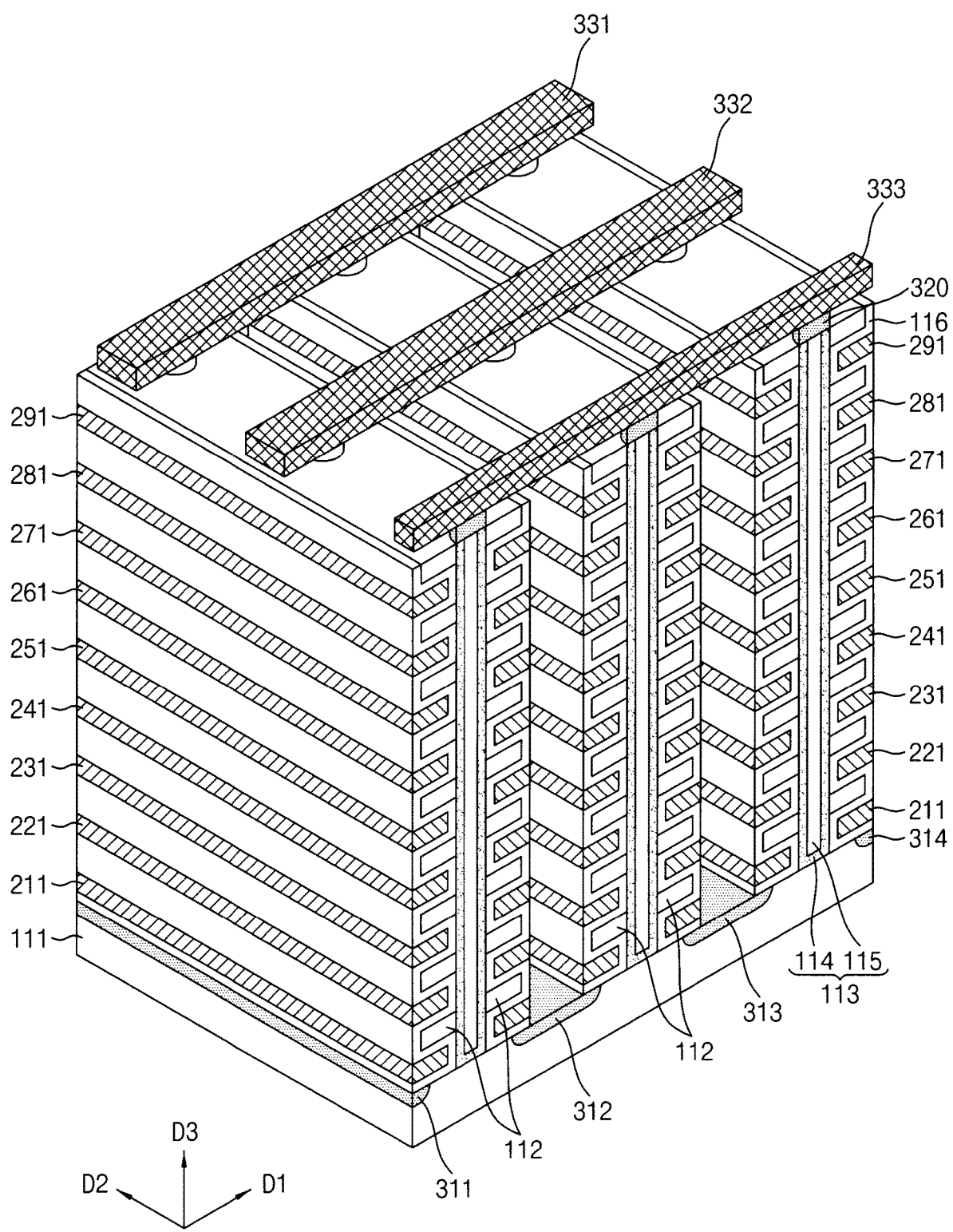
FIG. 5 is a perspective view illustrating an example of a memory block that is included in a memory cell array of the nonvolatile memory device of FIG. 4.

FIG. 5 is a perspective view illustrating an example of a memory block that is included in a memory cell array of the nonvolatile memory device of FIG. 4.

Referring to FIG. 5, a memory block BLKi includes NAND strings which are formed on a substrate in a three-dimensional structure (or a vertical structure). The memory block BLKi includes structures extending along first, second and third directions D1, D2 and D3. In one embodiment, the first direction D1 and the second direction D2 are perpendicular to each other in the same plane and may be referred to as horizontal directions and the third direction D3 is perpendicular to both the first direction D1 and second D2 and may be referred to as vertical direction.

A substrate 111 is provided. For example, the substrate 111 may have a well of a first type of charge carrier impurity (e.g., a first conductivity type) therein. For example, the substrate 111 may have a p-well formed by implanting a group 3 element such as boron (B). In particular, the substrate 111 may have a pocket p-well provided within an n-well. In an embodiment, the substrate 111 has a p-type well (or a p-type pocket well). However, the conductive type of the substrate 111 is not limited to p-type.

A plurality of doping regions 311, 312, 313 and 314 extending along the first direction D1 are provided in/on the substrate 111. These plurality of doping regions 311 to 314 may have a second type of charge carrier impurity (e.g., a second conductivity type) different from the first type of the substrate 111. In one embodiment of the invention, the first to fourth doping regions 311 to 314 may have n-type. However, the conductive type of the first to fourth doping regions 311 to 314 is not limited to n-type.

A plurality of insulation materials 112 extending along the second direction D2 are sequentially provided along the third direction D3 on a region of the substrate 111 between the first and second doping regions 311 and 312. For example, the plurality of insulation materials 112 are provided along the second direction D3, being spaced by a specific distance. For example, the insulation materials 112 may include an insulation material such as an oxide layer.

A plurality of pillars 113 penetrating the insulation materials along the third direction D3 are sequentially disposed along the second direction D2 on a region of the substrate 111 between the first and second doping regions 311 and 312. For example, the plurality of pillars 113 penetrate the insulation materials 112 to contact the substrate 111.

In some example embodiments, each pillar 113 may include a plurality of materials. For example, a channel layer 114 of each pillar 113 may include a silicon material having a first conductivity type. For example, the channel layer 114 of each pillar 113 may include a silicon material having the same conductivity type as the substrate 111. In one embodiment of the invention, the channel layer 114 of each pillar 113 includes p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. In some examples, the inner material 115 of each pillar 113 may include an air gap. The term "air" as discussed herein, may refer to atmospheric air, or other gases that may be present during the manufacturing process.

An insulation layer 116 is provided along the exposed surfaces of the insulation materials 112, the pillars 113, and the substrate 111, on a region between the first and second doping regions 311 and 312. For example, the insulation layer 116 provided on surfaces of the insulation material 112 may be interposed between pillars 113 and a plurality of stacked first conductive materials 211, 221, 231, 241, 251, 261, 271, 281 and 291, as illustrated. In some examples, the insulation layer 116 need not be provided between the first conductive materials 211 to 291 corresponding to ground selection lines GSL (e.g., 211) and string selection lines SSL (e.g., 291). In this example, the ground selection lines GSL are the lowermost ones of the stack of first conductive materials 211 to 291 and the string selection lines SSL are the uppermost ones of the stack of first conductive materials 211 to 291.

The plurality of first conductive materials 211 to 291 are provided on surfaces of the insulation layer 116, in a region between the first and second doping regions 311 and 312. For example, the first conductive material 211 extending along the second direction D2 is provided between the insulation material 112 adjacent to the substrate 111 and the substrate 111. In more detail, the first conductive material 211 extending along the second direction D2 is provided between the insulation layer 116 at the bottom of the insulation material 112 adjacent to the substrate 111 and the substrate 111.

A first conductive material extending along the second direction D2 is provided between the insulation layer 116 at the top of the specific insulation material among the insulation materials 112 and the insulation layer 116 at the bottom of a specific insulation material among the insulation materials 112. For example, a plurality of first conductive materials 221 to 281 extending along the second direction D2 are provided between the insulation materials 112 and it may be understood that the insulation layer 116 is provided between the insulation materials 112 and the first conductive materials 221 to 281. The first conductive materials 211 to 291 may be formed of a conductive metal, but in other embodiments of the invention the first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, a plurality of insulation materials 112 are provided, which extend along the second direction D2. And, a plurality of pillars 113 are provided that are disposed sequentially along the second direction D2 and penetrate the plurality of insulation materials 112 along the third direction D3. An insulation layer 116 is provided on the exposed surfaces of the plurality of insulation materials 112 and the plurality of pillars 113, and a plurality of first conductive materials 211 to 291 extend along the second direction D2. Similarly, the same structures as those on the first and second doping regions 311 and 312 may be provided in a region between the third and fourth doping regions 313 and 314.

A plurality of drain regions 320 are provided on the plurality of pillars 113, respectively. The drain regions 320 may include silicon materials doped with a second type of charge carrier impurity. For example, the drain regions 320 may include silicon materials doped with an n-type dopant. In one embodiment of the invention, the drain regions 320 include n-type silicon materials. However, the drain regions 320 are not limited to n-type silicon materials.

On the drain regions, a plurality of second conductive materials 331, 332 and 333 are provided, which extend along the first direction D1. The second conductive materials 331 to 333 are disposed along the second direction D2, being spaced apart from each other by a specific distance. The second conductive materials 331 to 333 are respectively connected to the drains 320 in a corresponding region. The drains 320 and the second conductive material 333 extending along the first direction D1 may be connected through each contact plug. Each contact plug may be, for example, a conductive plug formed of a conductive material such as a metal. The second conductive materials 331 to 333 may include metal materials. The second conductive materials 331 to 333 may include conductive materials such as a polysilicon.

In an example of FIG. 5, the first conductive materials 211 to 291 may be used to form the wordlines WL, the string selection lines SSL and the ground selection lines GSL. For example, the first conductive materials 221 to 281 may be used to form the wordlines WL, where conductive materials belonging to the same layer may be interconnected. The second conductive materials 331 to 333 may be used to form the bitlines BL. The number of layers of the first conductive materials 211 to 291 may be changed variously according to process and control techniques.

Figure 6:
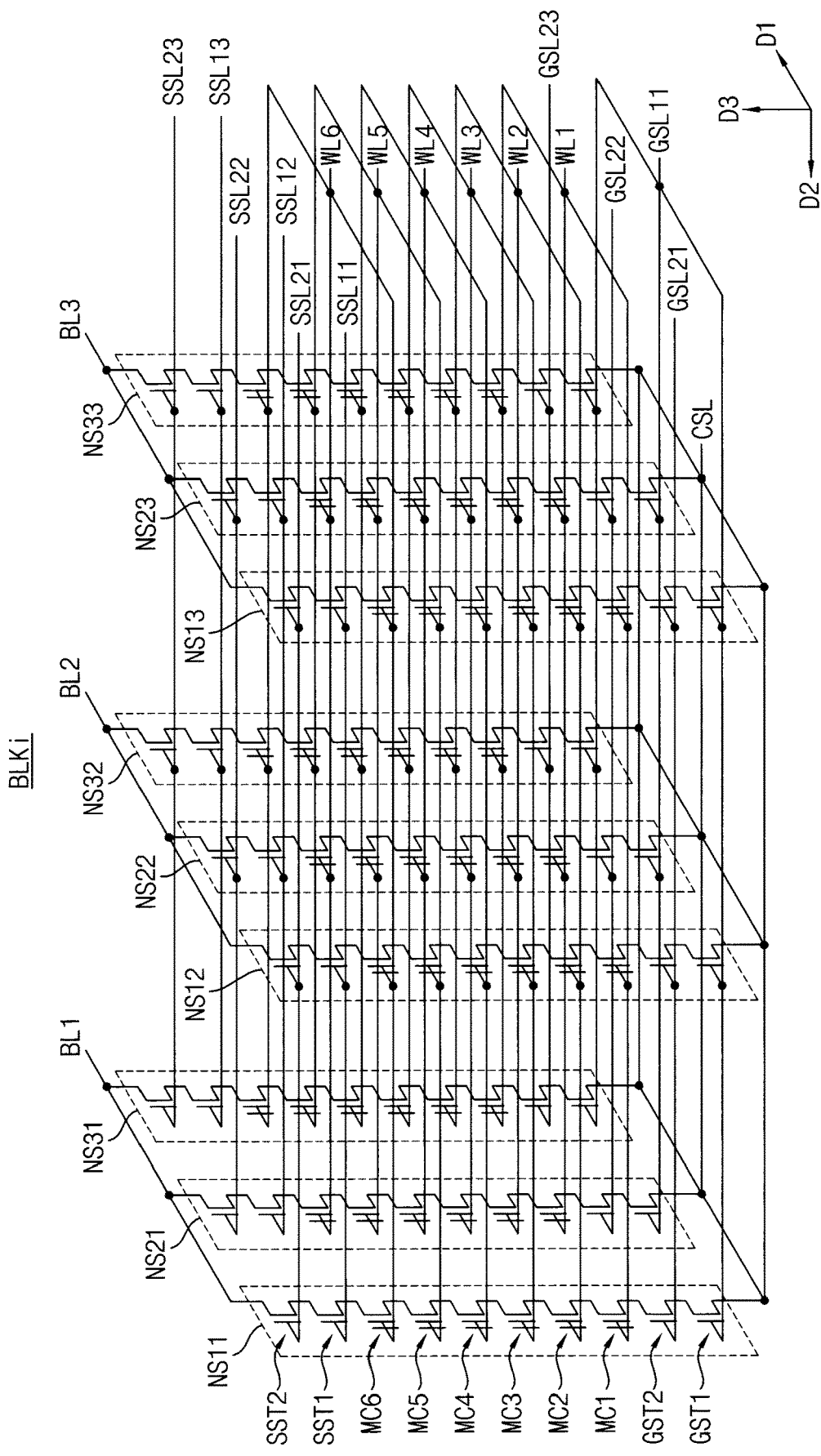
FIG. 6 is a circuit diagram illustrating an equivalent circuit of the memory block described with reference to FIG. 5.

FIG. 6 is a circuit diagram illustrating an equivalent circuit of the memory block described with reference to FIG. 5.

The memory block BLKi of FIG. 6 may be formed on a substrate in a three-dimensional structure (or a vertical structure). For example, a plurality of cell strings or NAND strings included in the memory block BLKi may be formed in a direction perpendicular to the substrate.

Referring to FIG. 6, the memory block BLKi may include a plurality of NAND strings NS11, NS12, NS13, NS21, NS22, NS23, NS31, NS32 and NS33 connected between bitlines BL1, BL2 and BL3 and a common source line CSL, as illustrated. Each of the NAND strings NS11 to NS33 may include a plurality of string selection transistors SST1 and SST2, a plurality of memory cells MC1, MC2, MC3, MC4, MC5 and MC6, and a plurality of ground selection transistors GST1 and GST2. For example, the bitlines BL1 to BL3 may correspond to the second conductive materials 331 to 333 in FIG. 5, and the common source line CSL may be formed by interconnecting the first to fourth doping regions 311 to 314 in FIG. 5.

The plurality of string selection transistors SST1 and SST2 may be connected to corresponding string selection lines SSL11, SSL12, SSL13, SSL21, SSL22 and SSL23, respectively. The plurality of memory cells MC1 to MC6 may be connected to corresponding wordlines WL1, WL2, WL3, WL4, WL5 and WL6, respectively. The plurality of ground selection transistors GST1 and GST2 may be connected to corresponding ground selection lines GSL11, GSL21, GSL22 and GSL23, respectively. The uppermost string selection transistors SST2 may be connected to corresponding bitlines BL1 to BL3, respectively, and the lowermost ground selection transistors GST1 may be connected to the common source line CSL. In the example of FIG. 6, some of the string selection transistors are connected to the same bitline to connect corresponding NAND strings to the same bitline upon appropriate selection via selection voltages applied to the appropriate sting selection lines and ground selection lines.

The cell strings connected in common to one bitline may form one column, and the cell strings connected to one string selection line may form one row. For example, the cell strings NS11, NS21 and NS31 connected to the first bitline BL1 may correspond to a first column, and the cell strings NS11, NS12 and NS13 connected to the first string selection line SSL1 may form a first row.

Wordlines (e.g., WL1) having the same height may be commonly connected, the ground selection lines GSL11 may be commonly connected, and the ground selection lines GSL21, GSL22 and GSL23 and the string selection lines SSL11, SSL12, SSL13, SSL21, SSL22 and SSL23 may be separated. Memory cells located at the same semiconductor layer share a wordline. Cell strings in the same row share a string selection line. The common source line CSL is connected in common to all of the cell strings.

A three-dimensional vertical array structure may include vertical NAND strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

Although the memory cell array included in the nonvolatile memory device according to example embodiments is described based on a NAND flash memory device, the nonvolatile memory device according to example embodiments may be any nonvolatile memory device, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Figure 7:
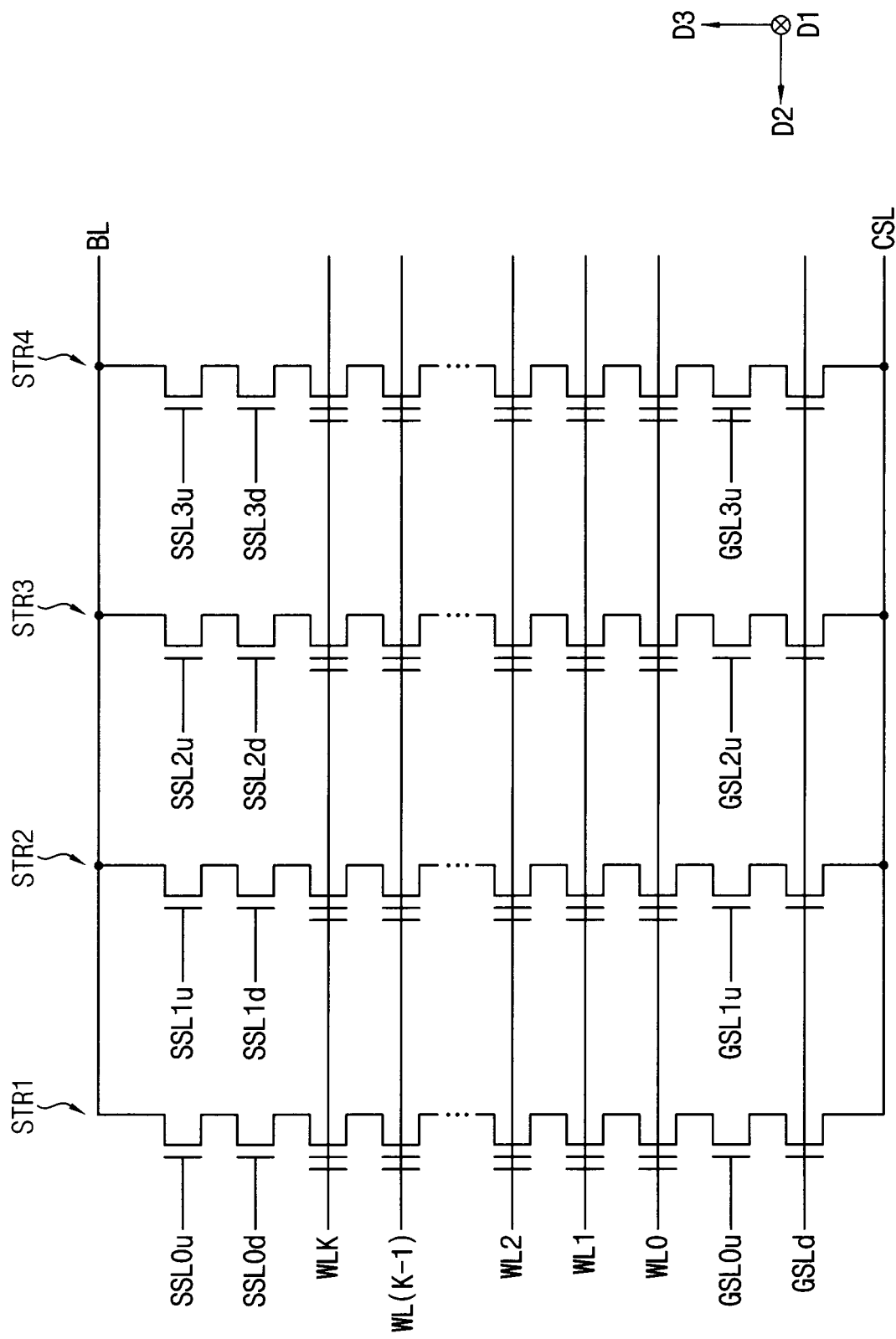
FIG. 7 is a circuit diagram illustrating a memory block according to example embodiments.

FIG. 7 is a circuit diagram illustrating a memory block according to example embodiments.

FIG. 7 illustrates only a plurality of cell strings STR1, STR2, STR3 and STR4 connected to a single bit line BL for convenience of illustration. As described with reference to FIGS. 5 and 6, a plurality of bitlines extending in the first direction D1 may be arranged in the second direction D2, and the cell strings respectively connected to the plurality of bitlines may be connected to each string selection line.

Referring to FIG. 7, a memory block may include a plurality of cell strings STR1~STR4, and each cell string may include a plurality of memory cells disposed in the vertical direction or the third direction D3.

String selection lines SSL0$u$, SSL1$u$, SSL2$u$, SSL3$u$, SSL0$d$, SSL1$d$, SSL2$d$ and SSL3$d$, wordlines WL0, WL1, WL2, . . . , WL(K-1) and WLK, and ground selection lines GSLd, GSL0$u$, GSL1$u$, GSL2$u$ and GSL3$u$ may be formed in a plurality of gate layers. In some example embodiments, at least one dummy wordline (e.g., a wordline line that is not electrically activated or connected to receive read and/or write voltages or whose information is ignored or not read by a controller) may be disposed between two adjacent wordlines and/or at least one of lower string selection lines SSL0$d$~SSL3$d$ and upper ground selection lines GSL0$u$~GSL3$u$ may be omitted.

In some example embodiments, as will be described with reference to FIGS. 8 through 13B, the erase voltage VERS may be applied to the common source line CSL, and ground selection transistors that are directly connected to the common source line CSL and a lower ground selection line GSLd may correspond to the selection transistors in step S200 of FIG. 1. In other example embodiments, as will be described with reference to FIGS. 14 through 16, the erase voltage VERS may be applied to the bitline BL, and string selection transistors that are directly connected to the bitline BL and upper string selection lines SSL0$u$~SSL3$u$ may correspond to the selection transistors in step S200 of FIG. 1.

Figure 8:
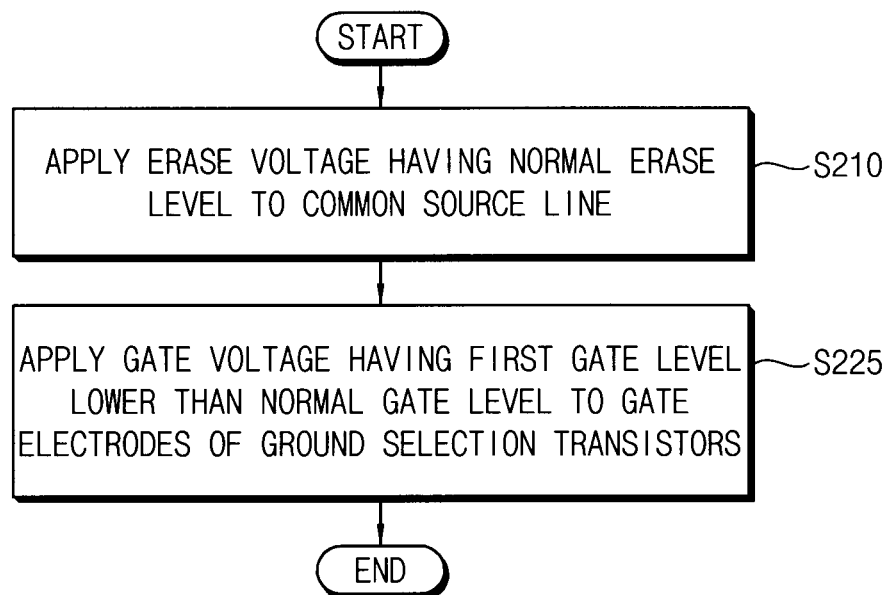
FIG. 8 is a flow chart illustrating an example of performing a data erase operation of FIG. 1.
Figure 9A:
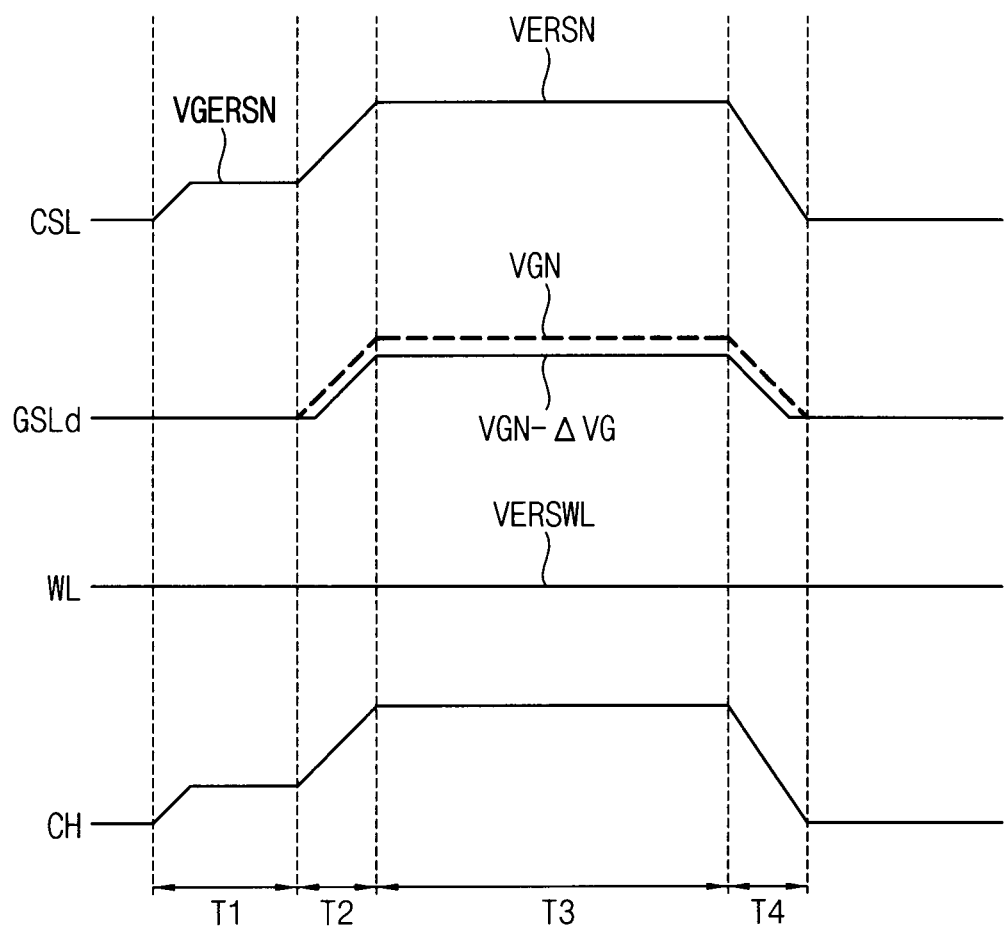
FIGS. 9A and 9B are diagrams for describing the data erase operation of FIG. 8.
Figure 9B:
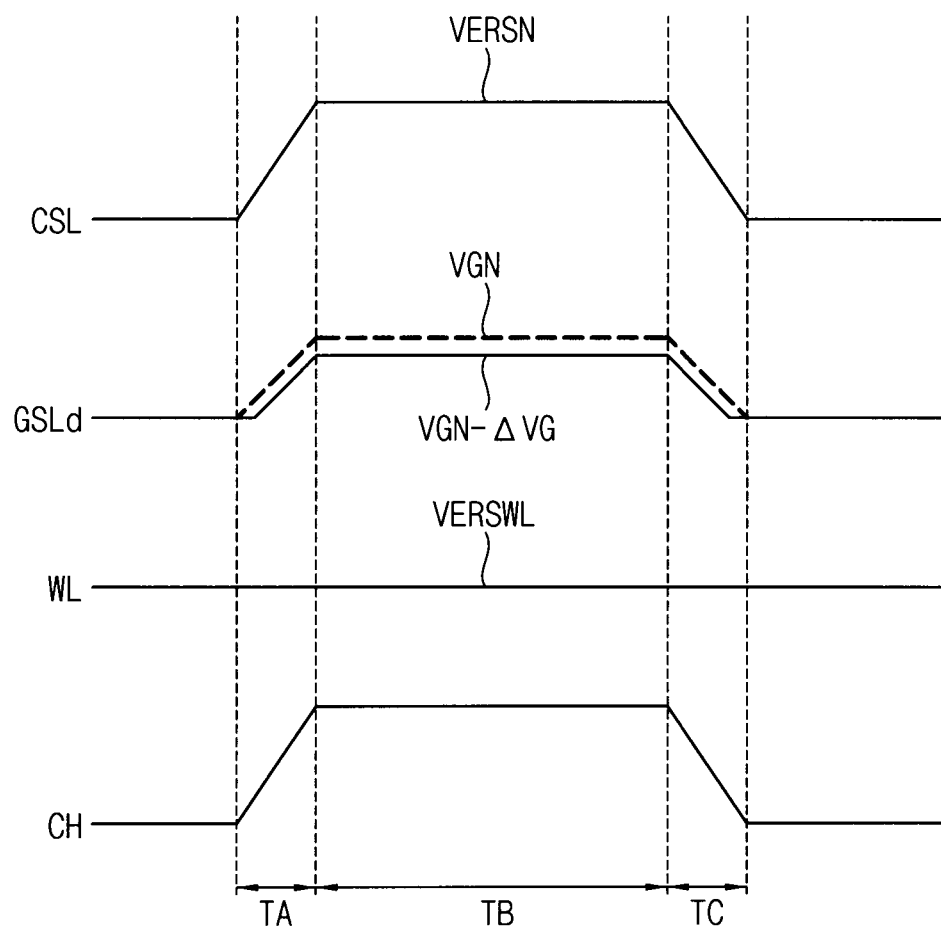

FIG. 8 is a flow chart illustrating an example of performing a data erase operation of FIG. 1. FIGS. 9A and 9B are diagrams for describing the data erase operation of FIG. 8.

Referring to FIGS. 7, 8, 9A and 9B, in performing the data erase operation, an erase voltage VERS having a normal erase level VERSN may be applied to a common source line CSL of the memory block (step S210). The normal erase level VERSN may correspond to an erase voltage VERS that may be applied to perform a normal data erase operation. For example, the normal data erase operation may consist of a plurality of erase loops and each erase loop may consist of an erase execution interval, a delay time interval, and a verify interval. During the normal data erase operation, erase operation conditions (e.g., the length of delay time, a counter pulse, and a level of a word line voltage applied during an erase operation, etc.) are not changed and a data erase operation condition set when the nonvolatile memory is released from a factory may be maintained as is. A data erase operation condition applied to a normal data erase operation may be set based on the condition that the nonvolatile memory operates at a room temperature.

For example, as illustrated in FIG. 9A, a level of the erase voltage VERS applied to the common source line CSL may have a normal GIDL erase level VGERSN during a time interval T1, may increase during a time interval T2, and may have the normal erase level VERSN during a time interval T3. For another example, as illustrated in FIG. 9B, a level of the erase voltage VERS applied to the common source line CSL may increase during a time interval TA, and may have the normal erase level VERSN during a time interval TB. The time interval T3 in FIG. 9A and the time interval TB in FIG. 9B may represent a time interval during which the data erase operation is actually performed.

While the erase voltage VERS is applied to the common source line CSL, a gate voltage having a first gate level VGN−ΔVG may be applied to gate electrodes of the ground selection transistors that are directly connected to the common source line CSL and the lower ground selection line GSLd (step S225). For example, the gate voltage having the first gate level VGN−ΔVG may be applied to the lower ground selection line GSLd. The first gate level VGN−ΔVG may be lower than a normal gate level VGN. The normal gate level VGN may correspond to a level of a voltage applied to gate electrodes of ground selection transistors when it is determined that the data erase characteristic is not degraded.

For example, as illustrated by dotted lines in FIGS. 9A and 9B, if the data erase characteristic is not degraded, a level of the gate voltage applied to the lower ground selection line GSLd may increase during the time interval T2 and the time interval TA, and may have the normal gate level VGN during the time interval T3 and the time interval TB. As illustrated by solid lines in FIGS. 9A and 9B, if the data erase characteristic is degraded, a level of the gate voltage applied to the lower ground selection line GSLd may increase during the time interval T2 and the time interval TA, and may have the first gate level VGN−ΔVG during the time interval T3 and the time interval TB.

In some example embodiments, as illustrated in FIGS. 9A and 9B, the gate voltage may have a reduced level during the time interval T3 and the time interval TB by maintaining an increment (e.g., an increasing slope) of the gate voltage and by delaying a time point at which the gate voltage increases. In other example embodiments, although not illustrated in FIGS. 9A and 9B, the gate voltage may have a reduced level during the time interval T3 and the time interval TB by maintaining a time point at which the gate voltage increases and by changing (e.g., reducing) an increment of the gate voltage.

In some example embodiments, the amount of change ΔVG in the level of the gate voltage may be determined based on a degree of degradation of the data erase characteristic, and may increase as the data erase characteristic is more severely degraded, as will be described with reference to FIGS. 17 through 22.

In examples of FIGS. 8, 9A and 9B, the erase voltage VERS having the normal erase level VERSN may be applied to the common source line CSL, and the gate voltage having the first gate level VGN−ΔVG may be applied to the lower ground selection line GSLd during the time interval T3 and the time interval TB. Thus, the voltage differences between the drain electrodes and the gate electrodes of the ground selection transistors may increase, and the data erase operation may be efficiently performed. For example, examples of FIGS. 8, 9A and 9B may correspond to an example of FIG. 3B in which the voltage at the gate electrodes of the GIDL injection transistors decreases and thus the amount of the GIDL current increases.

While the data erase operation is performed, an erase permission voltage VERSWL may be applied to the wordlines WL, and a voltage waveform in the channel CH may be similar to that of the erase voltage VERS.

After the data erase operation is completed, the erase voltage VERS and the gate voltage may decrease during a time interval T4 and a time interval TC.

In some example embodiments, the data erase operation may be performed for all of the cell strings STR1~STR4 with the same voltage condition because the ground selection transistors are connected to a single lower ground selection line GSLd in common as illustrated in FIG. 7.

Figure 10:
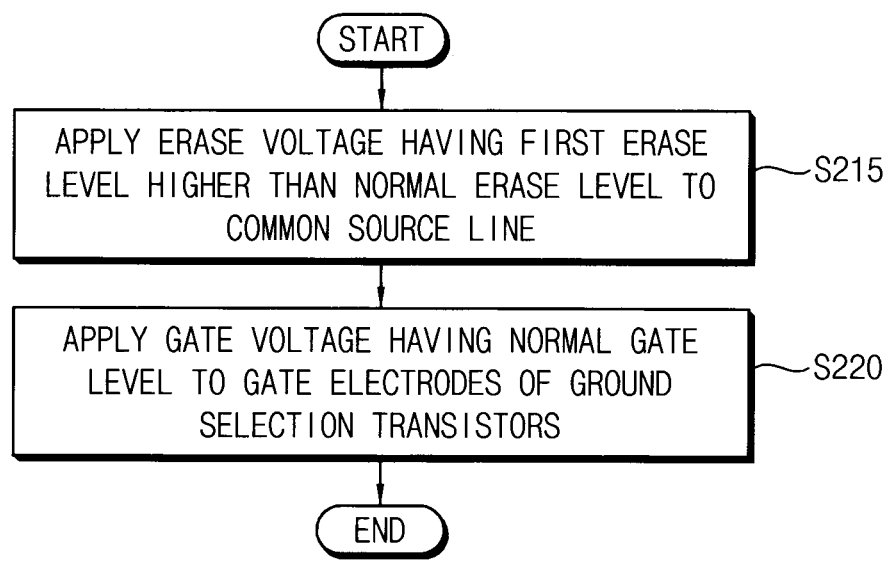
FIG. 10 is a flow chart illustrating another example of performing a data erase operation of FIG. 1.
Figure 11A:
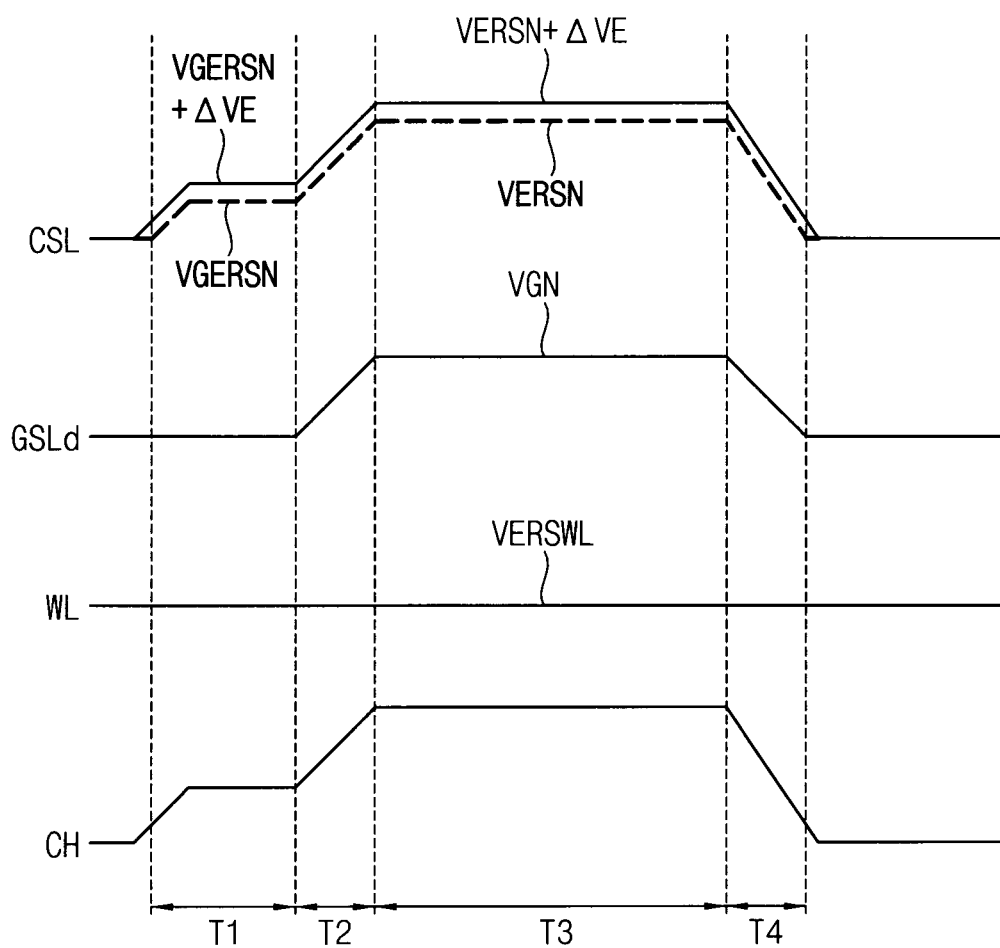
FIGS. 11A and 11B are diagrams for describing the data erase operation of FIG. 10.
Figure 11B:
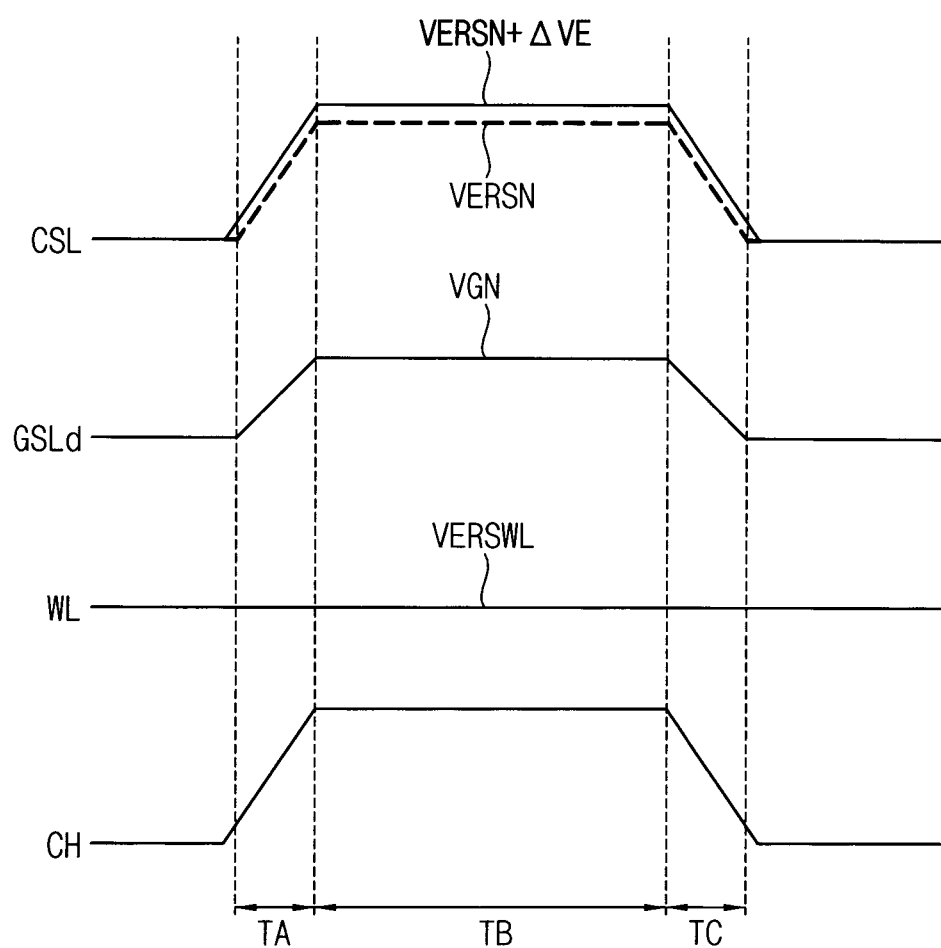

FIG. 10 is a flow chart illustrating another example of performing a data erase operation of FIG. 1. FIGS. 11A and 11B are diagrams for describing the data erase operation of FIG. 10. The descriptions repeated with FIGS. 8, 9A and 9B may be omitted.

Referring to FIGS. 7, 10, 11A and 11B, in performing the data erase operation, an erase voltage VERS having a first erase level VERSN+ΔVE may be applied to a common source line CSL of the memory block (step S215). The first erase level VERSN+ΔVE may be higher than a normal erase level VERSN.

For example, as illustrated by a dotted line in FIG. 11A, if the data erase characteristic is not degraded, a level of the erase voltage VERS applied to the common source line CSL may have a normal GIDL erase level VGERSN during a time interval T1, may increase during a time interval T2, and may have the normal erase level VERSN during a time interval T3. As illustrated by a solid line in FIG. 11A, if the data erase characteristic is degraded, a level of the erase voltage VERS applied to the common source line CSL may have a first GIDL erase level VGERSN+ΔVE during the time interval T1, may increase during the time interval T2, and may have the first erase level VERSN+ΔVE during the time interval T3. The first GIDL erase level VGERSN+ΔVE may be higher than the normal GIDL erase level VGERSN.

For another example, as illustrated by a dotted line in FIG. 11B, if the data erase characteristic is not degraded, a level of the erase voltage VERS applied to the common source line CSL may increase during a time interval TA, and may have the normal erase level VERSN during a time interval TB. As illustrated by a solid line in FIG. 11B, if the data erase characteristic is degraded, a level of the erase voltage VERS applied to the common source line CSL may increase during the time interval TA, and may have the first erase level VERSN+ΔVE during the time interval TB.

In some example embodiments, as illustrated in FIGS. 11A and 11B, the erase voltage VERS may have an increased level during the time interval T3 and the time interval TB by maintaining an increment (e.g., an increasing slope) of the erase voltage VERS and by shifting forward or leading a time point at which the erase voltage VERS increases. In other example embodiments, although not illustrated in FIGS. 11A and 11B, the erase voltage VERS may have an increased level during the time interval T3 and the time interval TB by maintaining a time point at which the erase voltage VERS increases and by changing (e.g., increasing) an increment of the erase voltage VERS.

In some example embodiments, the amount of change ΔVE in the level of the erase voltage VERS may be determined based on a degree of degradation of the data erase characteristic, and may increase as the data erase characteristic is more severely degraded, as will be described with reference to FIGS. 17 through 22.

While the erase voltage VERS is applied to the common source line CSL, a gate voltage having a normal gate level VGN may be applied to gate electrodes of the ground selection transistors that are directly connected to the common source line CSL and the lower ground selection line GSLd (step S220).

For example, as illustrated in FIGS. 11A and 11B, a level of the gate voltage applied to the lower ground selection line GSLd may increase during the time interval T2 and the time interval TA, and may have the normal gate level VGN during the time interval T3 and the time interval TB.

In examples of FIGS. 10, 11A and 11B, the erase voltage VERS having the first erase level VERSN+ΔVE may be applied to the common source line CSL, and the gate voltage having the normal gate level VGN may be applied to the lower ground selection line GSLd during the time interval T3 and the time interval TB. Thus, the voltage differences between the drain electrodes and the gate electrodes of the ground selection transistors may increase, and the data erase operation may be efficiently performed. For example, examples of FIGS. 10, 11A and 11B may correspond to an example of FIG. 3A in which the voltage at the drain electrodes of the GIDL injection transistors increases and thus the amount of the GIDL current increases.

Figure 12:
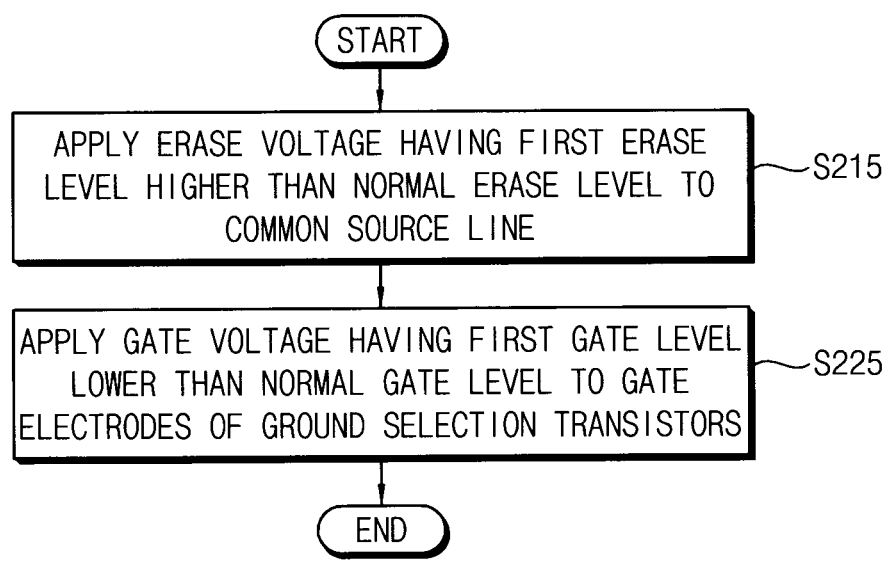
FIG. 12 is a flow chart illustrating still another example of performing a data erase operation of FIG. 1.
Figure 13A:
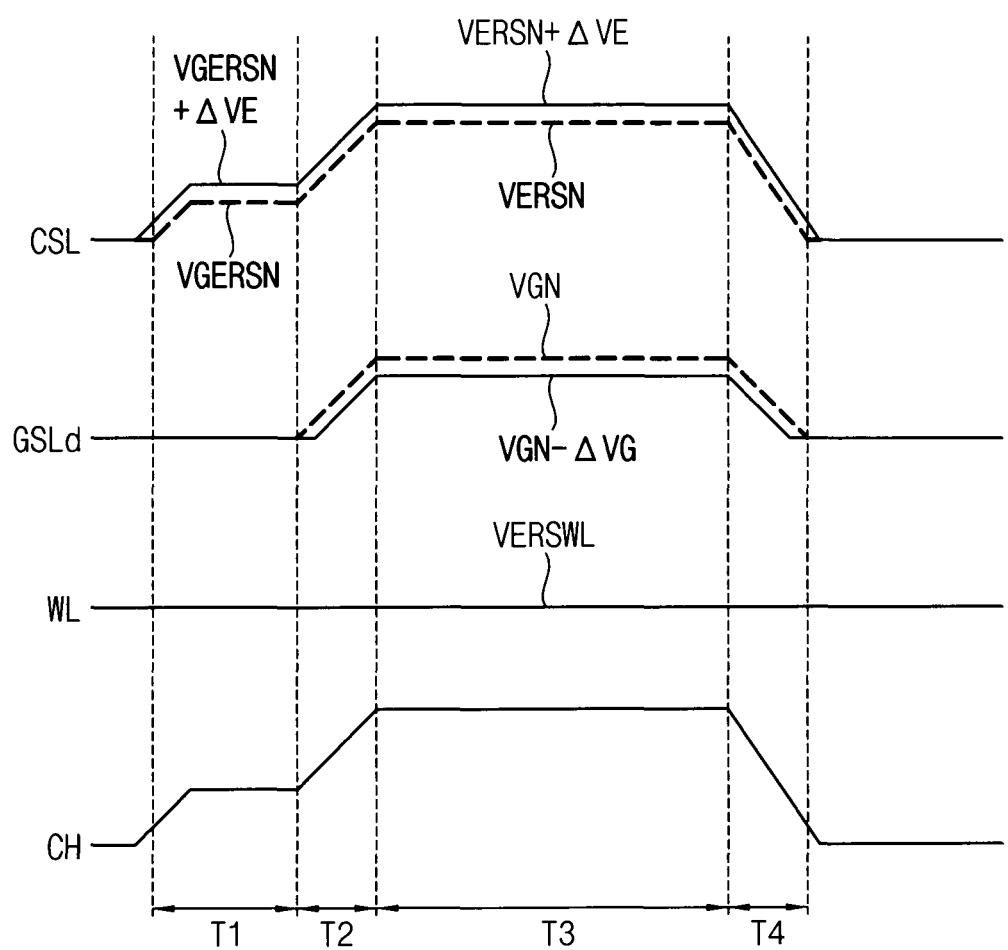
FIGS. 13A and 13B are diagrams for describing the data erase operation of FIG. 12.
Figure 13B:
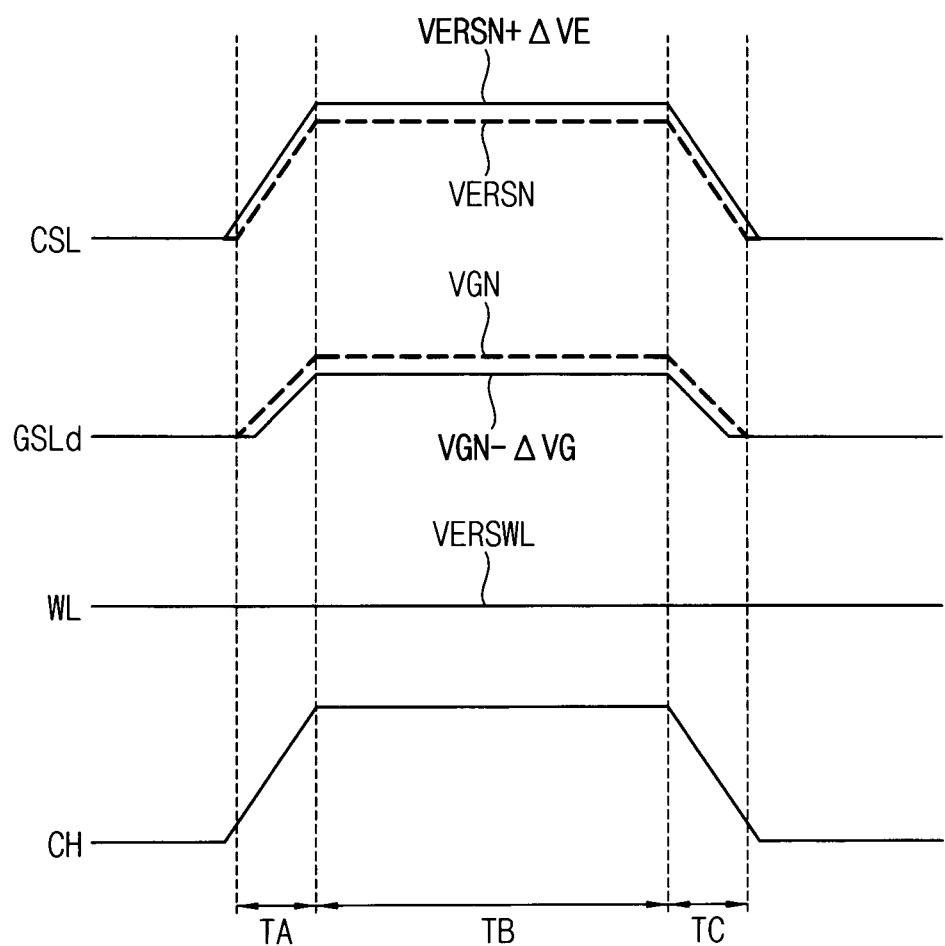

FIG. 12 is a flow chart illustrating still another example of performing a data erase operation of FIG. 1. FIGS. 13A and 13B are diagrams for describing the data erase operation of FIG. 12. The descriptions repeated with FIGS. 8, 9A, 9B, 10, 11A and 11B may be omitted.

Referring to FIGS. 7, 12, 13A and 13B, in performing the data erase operation, step S215 in FIG. 12 may be substantially the same as step S215 in FIG. 10, and thus the voltage change at the common source line CSL in FIGS. 13A and 13B may be substantially the same the voltage change at the common source line CSL in FIGS. 11A and 11B. In addition, step S225 in FIG. 12 may be substantially the same as step S225 in FIG. 8, and thus the voltage change at the lower ground selection line GSLd in FIGS. 13A and 13B may be substantially the same the voltage change at the lower ground selection line GSLd in FIGS. 9A and 9B. Examples of FIGS. 12, 13A and 13B may correspond to a combination of an example of FIG. 3A and an example of FIG. 3B in which the voltage at the drain electrodes of GIDL injection transistors increases and the voltage at the gate electrodes of the GIDL injection transistors decreases together and thus the amount of the GIDL current increases.

Figure 14:
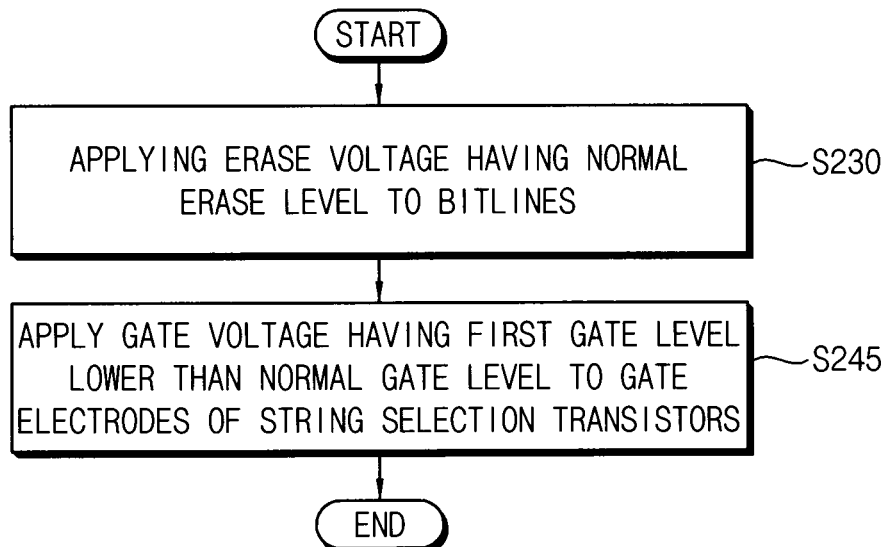
FIGS. 14, 15 and 16 are flow charts illustrating still other examples of performing a data erase operation of FIG. 1.
Figure 15:
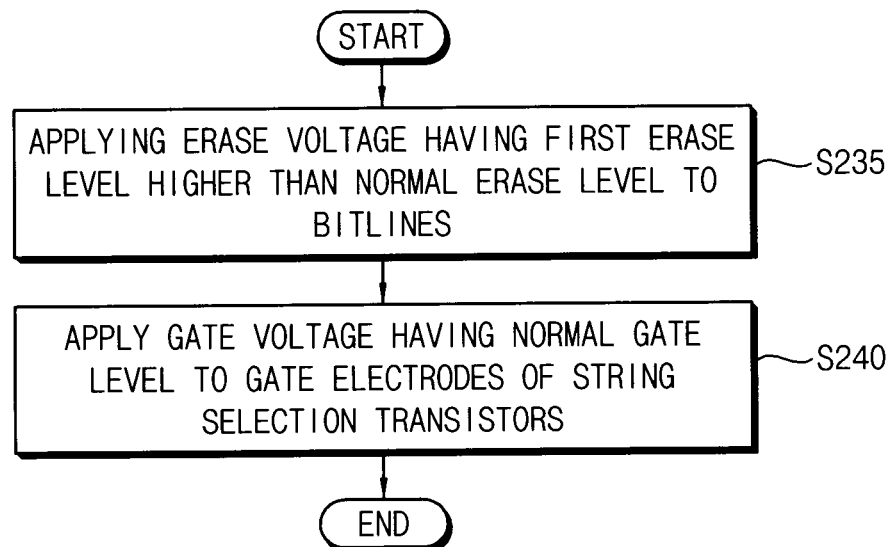
Figure 16:
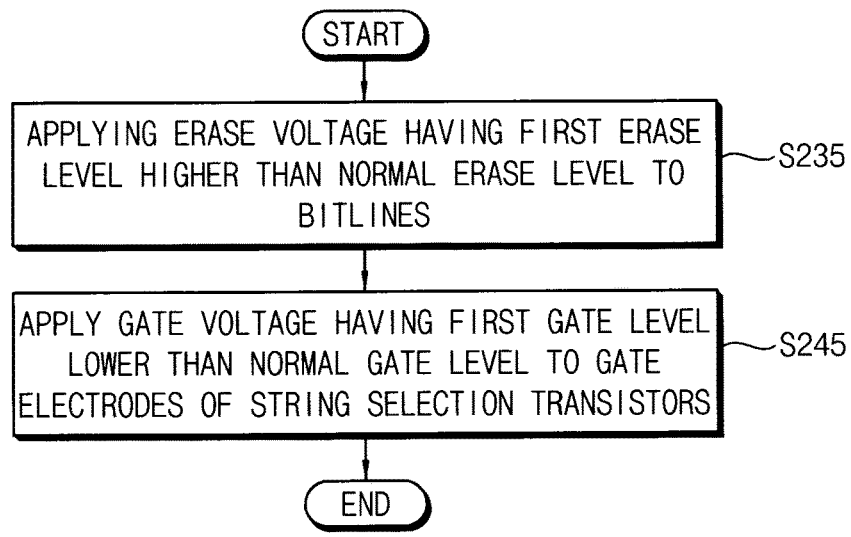

FIGS. 14, 15 and 16 are flow charts illustrating still other examples of performing a data erase operation of FIG. 1. The descriptions repeated with FIGS. 8, 9A, 9B, 10, 11A, 11B, 12, 13A and 13B may be omitted.

Referring to FIGS. 7 and 14, in performing the data erase operation, an erase voltage VERS having a normal erase level VERSN may be applied to a bitline BL of the memory block (step S230). While the erase voltage VERS is applied to the bitline BL, a gate voltage having a first gate level VGN−ΔVG may be applied to gate electrodes of the string selection transistors that are directly connected to the bitline BL and the upper string selection lines SSL0u~SSL3u (step S245). For example, the gate voltage having the first gate level VGN−ΔVG may be applied to the upper string selection lines SSL0u~SSL3u. The first gate level VGN−ΔVG may be lower than a normal gate level VGN.

Referring to FIGS. 7 and 15, in performing the data erase operation, an erase voltage VERS having a first erase level VERSN+ΔVE may be applied to a bitline BL of the memory block (step S235). The first erase level VERSN+ΔVE may be higher than a normal erase level VERSN. While the erase voltage VERS is applied to the bitline BL, a gate voltage having a normal gate level VGN may be applied to gate electrodes of the string selection transistors that are directly connected to the bitline BL and the upper string selection lines SSL0u~SSL3u (step S240).

Referring to FIGS. 7 and 16, in performing the data erase operation, step S235 in FIG. 16 may be substantially the same as step S235 in FIG. 15, and step S245 in FIG. 16 may be substantially the same as step S245 in FIG. 14.

Examples of FIGS. 14, 15 and 16 may be substantially the same as examples of FIGS. 8, 10 and 12, respectively, except that the common source line CSL and the ground selection transistors in FIGS. 8, 10 and 12 are replaced with the bitline BL and the string selection transistors in FIGS. 14, 15 and 16. The voltage changes at the bitline BL and the upper string selection lines SSL0u~SSL3u for examples of FIGS. 14, 15 and 16 may be substantially the same as the voltage changes at the common source line CSL and the lower ground selection line GSLd illustrated in FIGS. 9A, 9B, 11A, 11B, 13A and 13B, respectively.

For example, examples of FIGS. 8, 10 and 12 may represent a GSL side GIDL scheme or a bottom GIDL scheme, and examples of FIGS. 14, 15 and 16 may represent an SSL side GIDL scheme or a top GIDL scheme.

Although not illustrated in FIGS. 8 through 16, the data erase operation may be performed based on a combination of the bottom GIDL scheme and the top GIDL scheme. For example, the GIDL phenomenon (e.g., the GIDL current) may occur at both top (e.g., an SSL side) and bottom (e.g., a GSL side) of the memory block, and at least one of the level of the erase voltage VERS and the level of the gate voltage may be controlled or adjusted so that the voltage differences between the drain electrodes and the gate electrodes of the GIDL injection transistors increase.

In some example embodiments, the data erase operation may be performed for the cell strings STR1~STR4 with the different voltage conditions because the string selection transistors are connected to the upper string selection lines SSL0u~SSL3u, respectively, as illustrated in FIG. 7. For example, the data erase operation may be performed by setting a different level of the voltage for each of the string selection transistors and by individually and independently controlling the voltage for each of the string selection lines SSL0u~SSL3u or the cell strings STR1~STR4.

Figure 17:
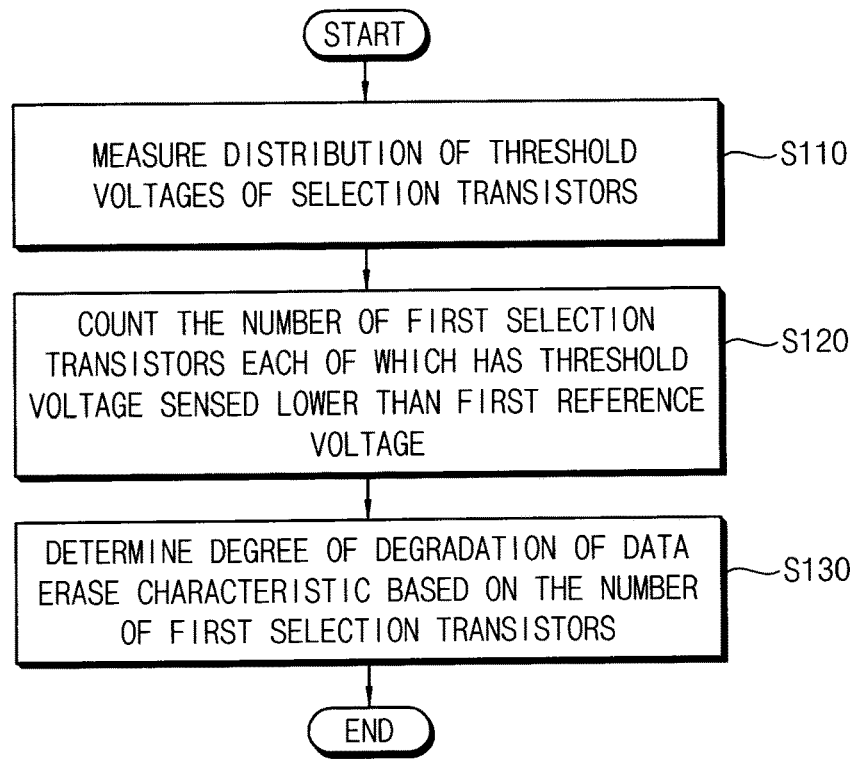
FIG. 17 is a flow chart illustrating an example of determining whether a data erase characteristic is degraded of FIG. 1.

FIG. 17 is a flow chart illustrating an example of determining whether a data erase characteristic is degraded of FIG. 1.

Referring to FIG. 17, in determining whether the data erase characteristic is degraded, a distribution of threshold voltages of the selection transistors (e.g., the GIDL injection transistors) may be measured (step S110). For example, a distribution of threshold voltages of the ground selection transistors may be measured in examples of FIGS. 8, 10 and 12, and a distribution of threshold voltages of the string selection transistors may be measured in examples of FIGS. 14, 15 and 16.

The number of first selection transistors among the selection transistors may be counted (step S120). A threshold voltage of the first selection transistor may be sensed lower than a first reference voltage. A degree of degradation of the data erase characteristic may be determined based on the number of the first selection transistors (step S130).

Figure 18:
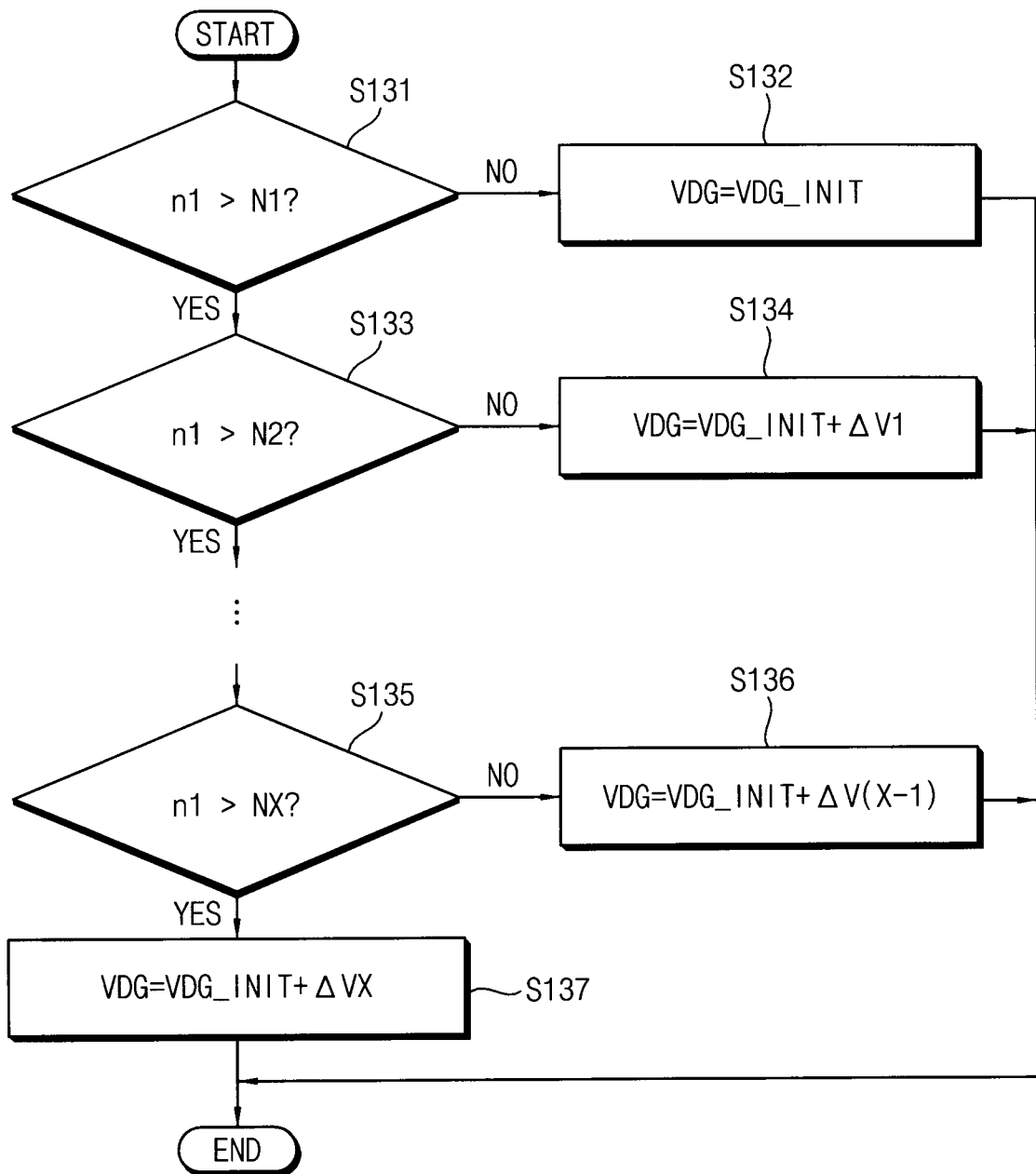
FIG. 18 is a flow chart illustrating an example of determining a degree of degradation of a data erase characteristic of FIG. 17.

FIG. 18 is a flow chart illustrating an example of determining a degree of degradation of a data erase characteristic of FIG. 17.

Referring to FIGS. 17 and 18, in determining the degree of degradation of the data erase characteristic, a selection transistor having a threshold voltage lower than the first reference voltage may indicate that the selection transistor is degraded or deteriorated, and thus it may be determined that the data erase characteristic is more severely degraded as the number of the first selection transistors increases. To compensate the degradation of the data erase characteristic during the data erase operation, the amount of change in the level of the voltage applied to the selection transistors (e.g., the voltage difference between the drain electrodes and the gate electrodes of the selection transistors) may increase as the number of the first selection transistors increases.

For example, when the number n1 of the first selection transistors is smaller than or equal to a first number N1 (step S131: NO), it may be determined that the data erase characteristic is not degraded, and a voltage difference VDG between the drain electrodes and the gate electrodes of the selection transistors may be set to an initial value VDG_INIT (step S132).

When the number n1 of the first selection transistors is greater than the first number N1 (step S131: YES), and when the number n1 of the first selection transistors is smaller than or equal to a second number N2 (step S133: NO), it may be determined that the data erase characteristic is slightly degraded. Since the data erase characteristic is slightly degraded, the voltage difference VDG between the drain electrodes and the gate electrodes of the selection transistors may increase from the initial value VDG_INIT by ΔV1 (step S134).

Similarly, when the number n1 of the first selection transistors is greater than the second number N2 (step S133: YES), and when the number n1 of the first selection transistors is smaller than or equal to an X-th number NX where X is a natural number greater than or equal to three (step S135: NO), it may be determined that the data erase characteristic is more severely degraded. Since the data erase characteristic is more severely degraded, the voltage difference VDG between the drain electrodes and the gate electrodes of the selection transistors may increase from the initial value VDG_INIT by ΔV(X−1) (step S136).

When the number n1 of the first selection transistors is greater than the X-th number NX (step S135: YES), it may be determined that the data erase characteristic is most severely degraded. Since the data erase characteristic is most severely degraded, the voltage difference VDG between the drain electrodes and the gate electrodes of the selection transistors may increase from the initial value VDG_INIT by ΔVX (step S137).

As described above, the voltage difference VDG between the drain electrodes and the gate electrodes of the selection transistors may increase as the number n1 of the first selection transistors increases. Thus, a value may increase in an order of the first number N1, the second number N2, ..., and the X-th number NX (e.g., N1<N2<...<NX), and a value may increase in an order of ΔV1, ..., ΔV(X−1), and ΔVX (e.g., ΔV1<ΔV(X−1)<...<ΔVX).

In some example embodiments, when the degradation of the data erase characteristic is compensated by decreasing the gate voltage applied to the gate electrodes of the selection transistors (e.g., in examples of FIGS. 8 and 14), the amount of change (e.g., ΔV1~ΔVX) in the voltage difference VDG between the drain electrodes and the gate electrodes of the selection transistors may correspond to the amount of change ΔVG in the level of the gate voltage illustrated in FIGS. 9A and 9B. In other example embodiments, when the degradation of the data erase characteristic is compensated by increasing the erase voltage VERS applied to the common source line CSL and the bitline BL or the drain electrodes of the selection transistors (e.g., in examples of FIGS. 10 and 15), the amount of change (e.g., ΔV1~ΔVX) in the voltage difference VDG between the drain electrodes and the gate electrodes of the selection transistors may correspond to the amount of change ΔVE in the level of the erase voltage VERS illustrated in FIGS. 11A and 11B.

Figure 19:
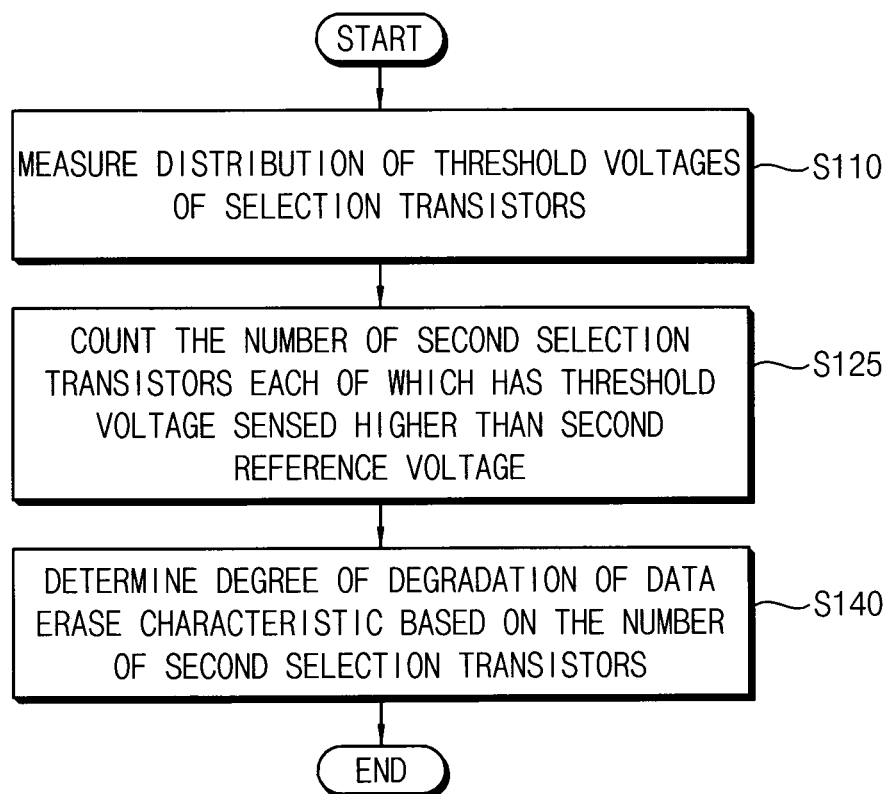
FIG. 19 is a flow chart illustrating another example of determining whether a data erase characteristic is degraded of FIG. 1.

FIG. 19 is a flow chart illustrating another example of determining whether a data erase characteristic is degraded of FIG. 1. The descriptions repeated with FIG. 17 may be omitted.

Referring to FIG. 19, in determining whether the data erase characteristic is degraded, a distribution of threshold voltages of the selection transistors may be measured (step S110).

The number of second selection transistors among the selection transistors may be counted (step S125). A threshold voltage of the second selection transistor may be sensed higher than a second reference voltage. The second reference voltage may be substantially the same as or different from the first reference voltage in FIG. 17. A degree of degradation of the data erase characteristic may be determined based on the number of the second selection transistors (step S140).

Figure 20:
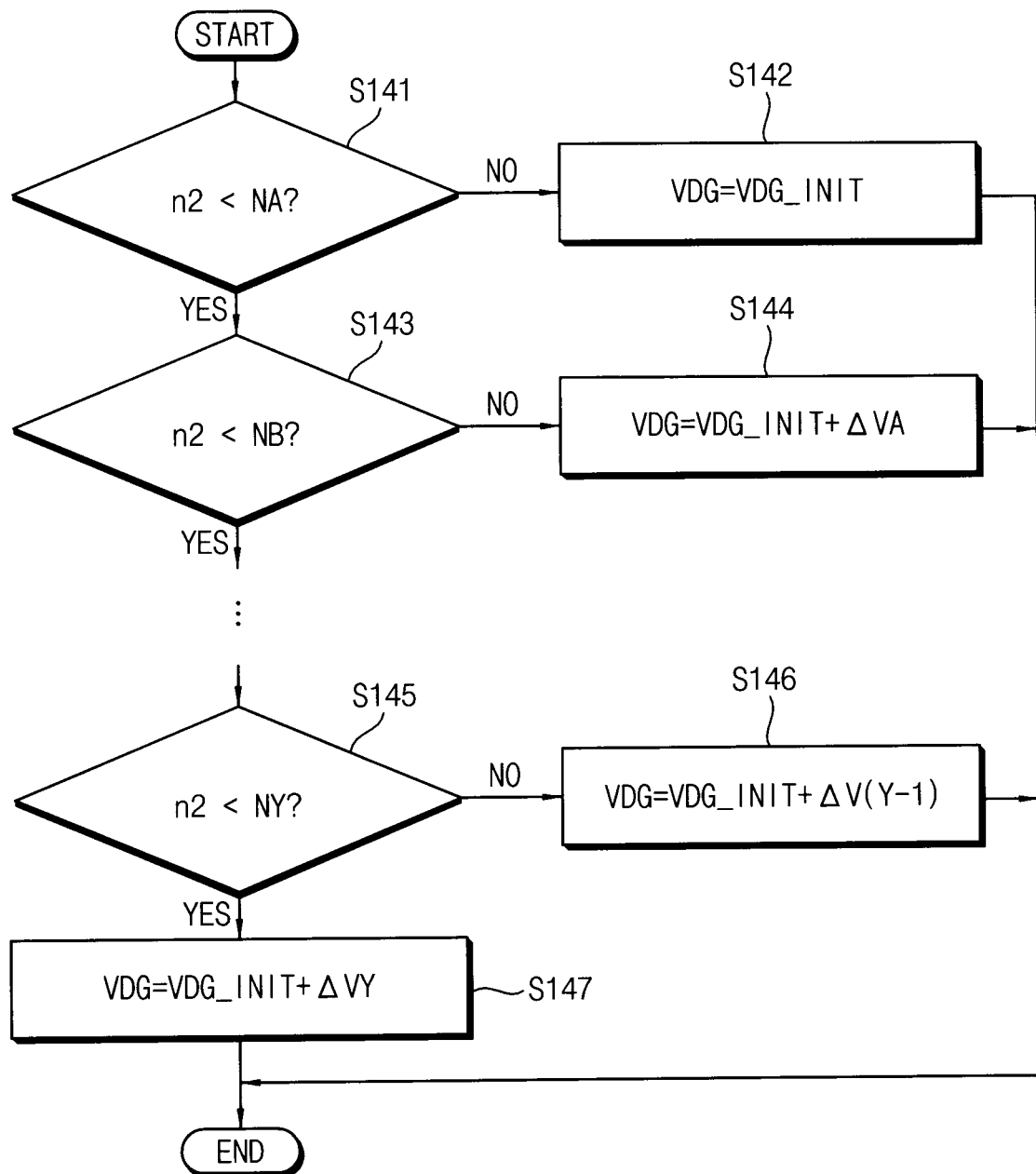
FIG. 20 is a flow chart illustrating an example of determining a degree of degradation of a data erase characteristic of FIG. 19.

FIG. 20 is a flow chart illustrating an example of determining a degree of degradation of a data erase characteristic of FIG. 19. The descriptions repeated with FIG. 18 may be omitted.

Referring to FIGS. 19 and 20, in determining the degree of degradation of the data erase characteristic, a selection transistor having a threshold voltage higher than the second reference voltage may indicate that the selection transistor is not degraded or deteriorated, and thus it may be determined that the data erase characteristic is more severely degraded as the number of the second selection transistors decreases. To compensate the degradation of the data erase characteristic during the data erase operation, the amount of change in the level of the voltage applied to the selection transistors may increase as the number of the first selection transistors increases.

For example, when the number n2 of the second selection transistors is greater than or equal to a first number NA (step S141: NO), it may be determined that the data erase characteristic is not degraded, and a voltage difference VDG between the drain electrodes and the gate electrodes of the selection transistors may be set to an initial value VDG_INIT (step S142).

When the number n2 of the second selection transistors is smaller than the first number NA (step S141: YES), and when the number n2 of the second selection transistors is greater than or equal to a second number NB (step S143: NO), it may be determined that the data erase characteristic is slightly degraded, and the voltage difference VDG between the drain electrodes and the gate electrodes of the selection transistors may increase from the initial value VDG_INIT by ΔVA (step S144).

When the number n2 of the second selection transistors is smaller than the second number NB (step S143: YES), and when the number n2 of the second selection transistors is greater than or equal to an Y-th number NY where Y is a natural number greater than or equal to three (step S145: NO), it may be determined that the data erase characteristic is more severely degraded, and the voltage difference VDG between the drain electrodes and the gate electrodes of the selection transistors may increase from the initial value VDG_INIT by ΔV(Y−1) (step S146).

When the number n2 of the second selection transistors is smaller than the Y-th number NY (step S145: YES), it may be determined that the data erase characteristic is most severely degraded, and the voltage difference VDG between the drain electrodes and the gate electrodes of the selection transistors may increase from the initial value VDG_INIT by ΔVY (step S147).

As described above, the voltage difference VDG between the drain electrodes and the gate electrodes of the selection transistors may increase as the number n2 of the second selection transistors decreases. Thus, a value may decrease in an order of the first number NA, the second number NB, ..., and the Y-th number NY (e.g., NA>NB>...>NY), and a value may increase in an order of ΔVA, ..., ΔV(Y−1), and ΔVY (e.g., ΔVA<ΔV(Y−1)<...<ΔVY). The values NA~NY and the values ΔVA~ΔVY in FIG. 20 may be substantially the same as or different from the values N1~NX and the values ΔV1~ΔVX.

Figure 21:
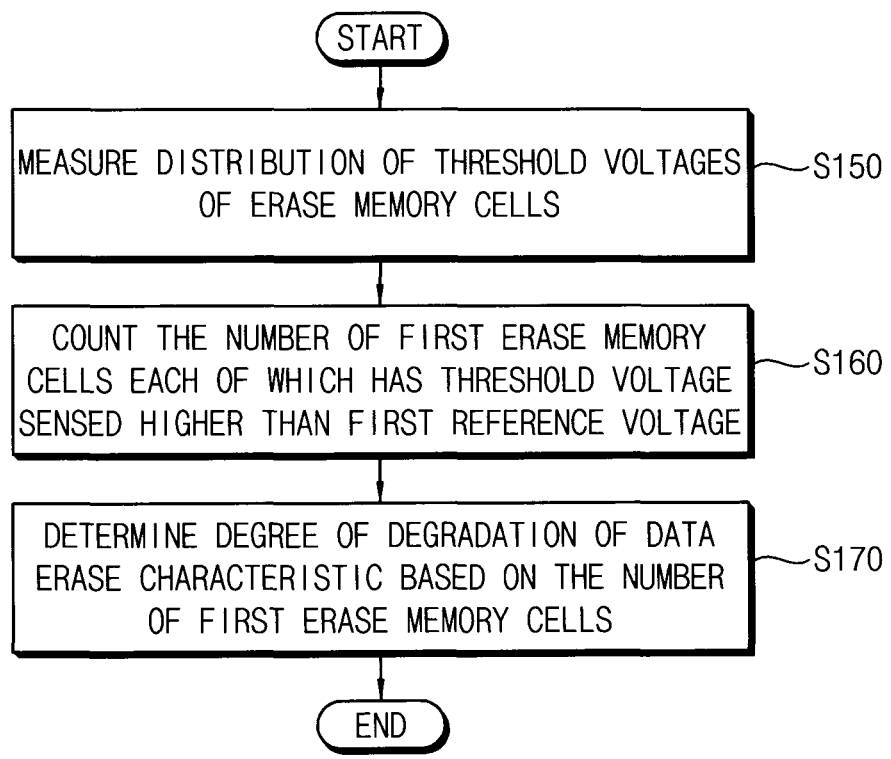
FIGS. 21 and 22 are flow charts illustrating still other example of determining whether a data erase characteristic is degraded of FIG. 1.
Figure 22:
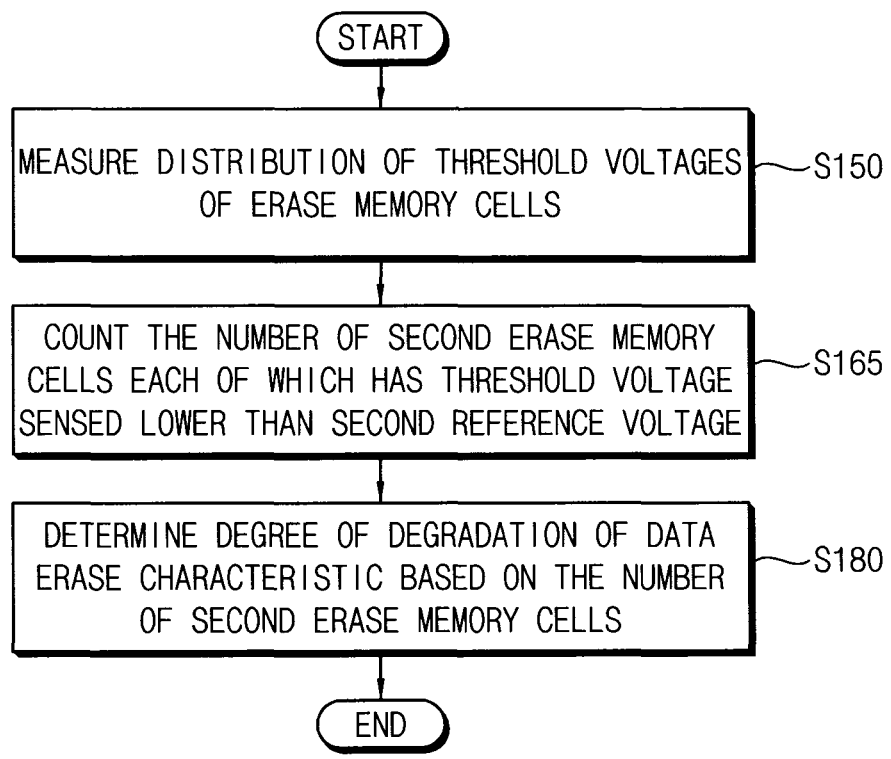

FIGS. 21 and 22 are flow charts illustrating still other example of determining whether a data erase characteristic is degraded of FIG. 1. The descriptions repeated with FIGS. 17 and 19 may be omitted.

Referring to FIG. 21, in determining whether the data erase characteristic is degraded, a distribution of threshold voltages of erase memory cells among the plurality of memory cells may be measured (step S150). The erase memory cell may have an erase state. A degree of degradation of the data erase characteristic may be determined using the selection transistors in examples of FIGS. 17 and 19, however, a degree of degradation of the data erase characteristic may be determined using the erase memory cells in examples of FIGS. 21 and 22.

The number of first erase memory cells among the erase memory cells may be counted (step S160). A threshold voltage of the first erase memory cell may be sensed higher than a first reference voltage. The first reference voltage in FIG. 21 may be different from the first reference voltage in FIG. 17. A degree of degradation of the data erase characteristic may be determined based on the number of the first erase memory cells (step S170).

In determining the degree of degradation of the data erase characteristic, an erase memory cell having a threshold voltage higher than the first reference voltage may indicate that the erase memory cell does not have a normal erase state, and thus it may be determined that the data erase characteristic is more severely degraded as the number of the first erase memory cells increases. To compensate the degradation of the data erase characteristic during the data erase operation, the amount of change in the level of the voltage applied to the selection transistors may increase as the number of the first erase memory cells increases. For example, step S170 in FIG. 21 may be implemented similar to step S130 in FIG. 17 and an example of FIG. 18.

Referring to FIG. 22, in determining whether the data erase characteristic is degraded, a distribution of threshold voltages of the erase memory cells among the plurality of memory cells may be measured (step S150). The number of second erase memory cells among the erase memory cells may be counted (step S165). A threshold voltage of the second erase memory cell may be sensed lower than a second reference voltage. The second reference voltage in FIG. 22 may be different from the second reference voltage in FIG. 19. A degree of degradation of the data erase characteristic may be determined based on the number of the second erase memory cells (step S180).

In determining the degree of degradation of the data erase characteristic, an erase memory cell having a threshold voltage lower than the second reference voltage may indicate that the erase memory cell has a normal erase state, and thus it may be determined that the data erase characteristic is more severely degraded as the number of the second erase memory cells decreases. To compensate the degradation of the data erase characteristic during the data erase operation, the amount of change in the level of the voltage applied to the selection transistors may increase as the number of the second erase memory cells decreases. For example, step S180 in FIG. 22 may be implemented similar to step S140 in FIG. 19 and an example of FIG. 20.

Figure 23:
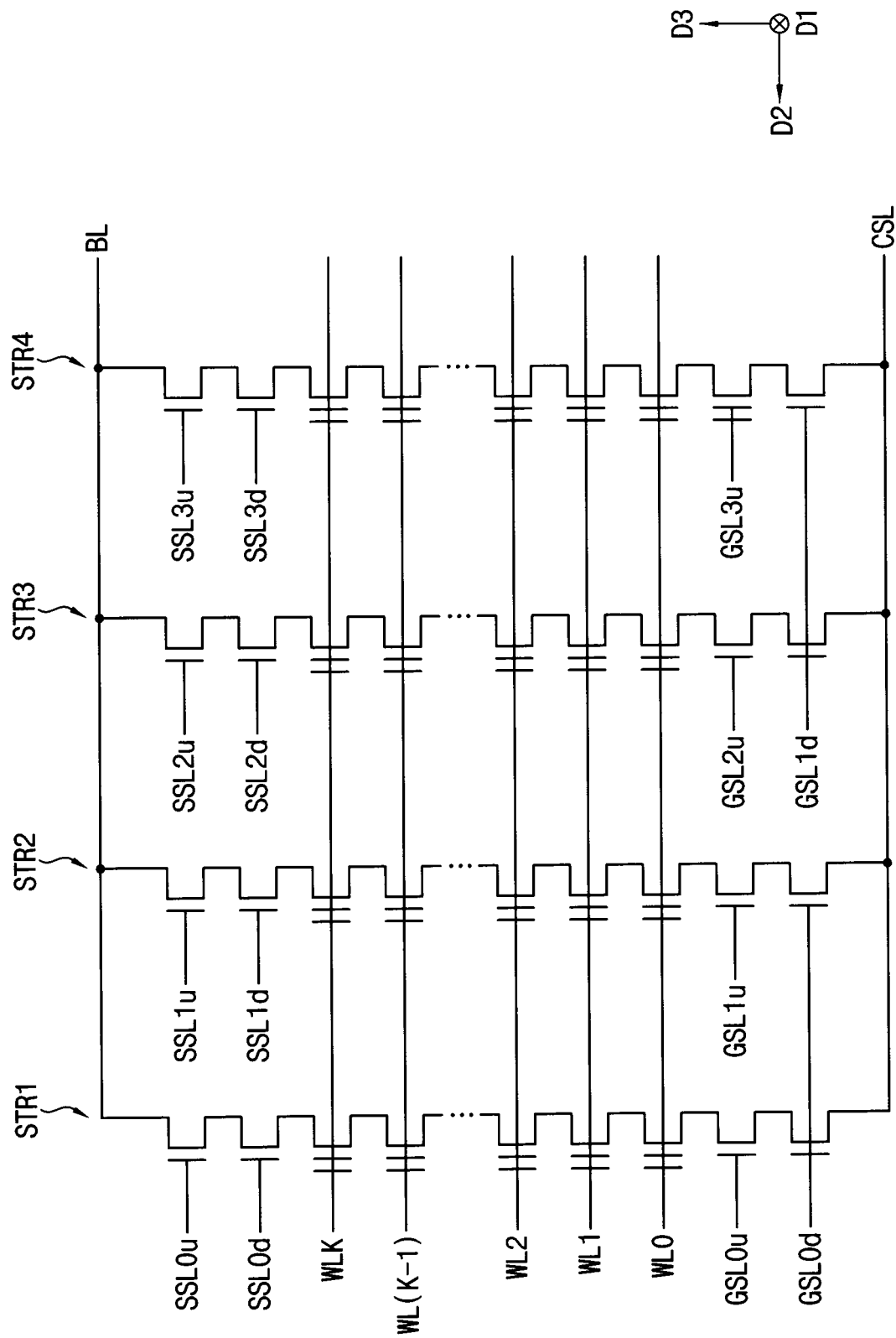
FIGS. 23 and 24 are circuit diagrams illustrating a memory block according to example embodiments.
Figure 24:
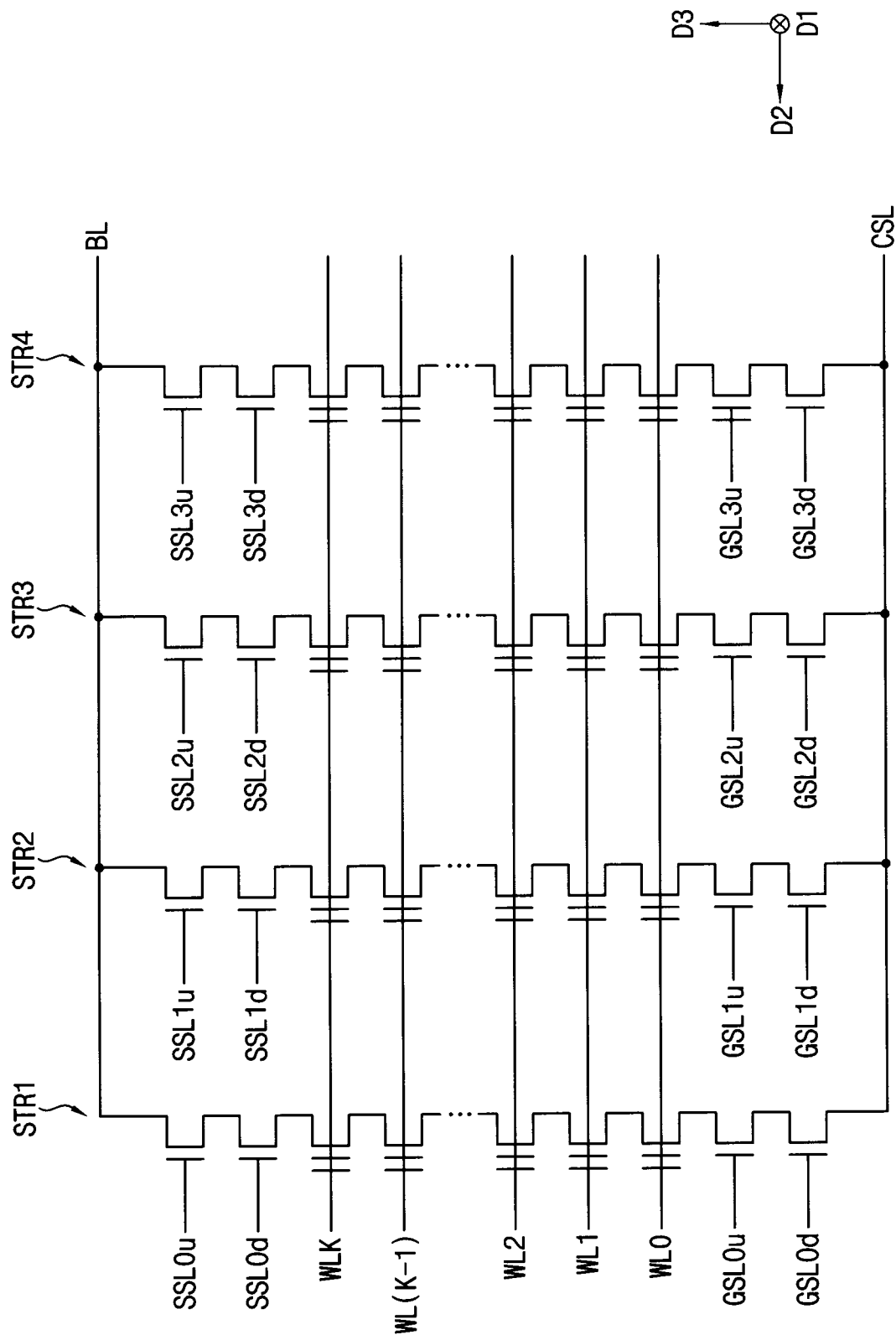

FIGS. 23 and 24 are circuit diagrams illustrating a memory block according to example embodiments.

Referring to FIG. 23, a memory block of FIG. 23 may be substantially the same as a memory block of FIG. 7, except that the lower ground selection line GSLd in FIG. 7 is replaced with two separate lower ground selection lines GSL0d and GSL1d in FIG. 23. Unlike an example of FIG. 7, the data erase operation may be performed for the cell strings STR1~STR4 in the memory block of FIG. 23 with the different voltage conditions when the data erase operation is performed based on a GSL side GIDL scheme. For example, the data erase operation may be performed by setting a different level of the voltage and by individually and independently controlling the voltage for a first group of cell strings STR1 and STR2 connected to the lower ground selection line GSL0d and a second group of cell strings STR3 and STR4 connected to the lower ground selection line GSL1d.

Referring to FIG. 24, a memory block of FIG. 24 may be substantially the same as a memory block of FIG. 7, except that the lower ground selection line GSLd in FIG. 7 is replaced with four separate lower ground selection lines GSL0d, GSL1d, GSL2d and GSL3d in FIG. 24. The data erase operation may be performed for the cell strings STR1~STR4 in the memory block of FIG. 24 with the different voltage conditions when the data erase operation is performed based on a GSL side GIDL scheme. For example, the data erase operation may be performed by setting a different level of the voltage and by individually and independently controlling the voltage for each of the cell strings STR1~STR4.

Although not illustrated in FIGS. 7, 23 and 24, as with the lower ground selection line, the upper string selection line may be connected to two or more cell strings in common.

Figure 25:
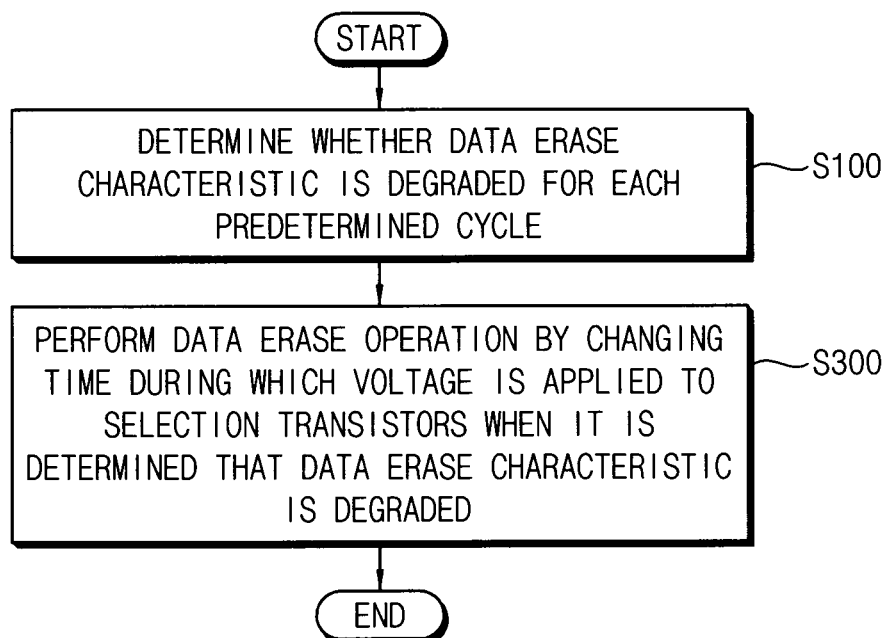
FIG. 25 is a flow chart illustrating a method of erasing data in a nonvolatile memory device according to example embodiments.

FIG. 25 is a flow chart illustrating a method of erasing data in a nonvolatile memory device according to example embodiments. The descriptions repeated with FIG. 1 may be omitted.

Referring to FIG. 25, in a method of erasing data in a nonvolatile memory device according to example embodiments, it is determined whether a data erase characteristic for the memory block is degraded or not for each predetermined cycle (step S100). When it is determined that the data erase characteristic is degraded or deteriorated, a data erase operation is performed by changing time during which a voltage is applied to selection transistors for selecting the memory block as an erase target block (step S300).

In step S300 of performing the data erase operation according to example embodiments, the amount of the GIDL current may be controlled or adjusted by changing the time or time interval during which the voltage is applied to the selection transistors without structural modification, thereby improving or enhancing the characteristic and reliability of the data erase operation. For example, the amount of the GIDL current may increase as the time during which the voltage is applied to the selection transistors increases.

Figure 26:
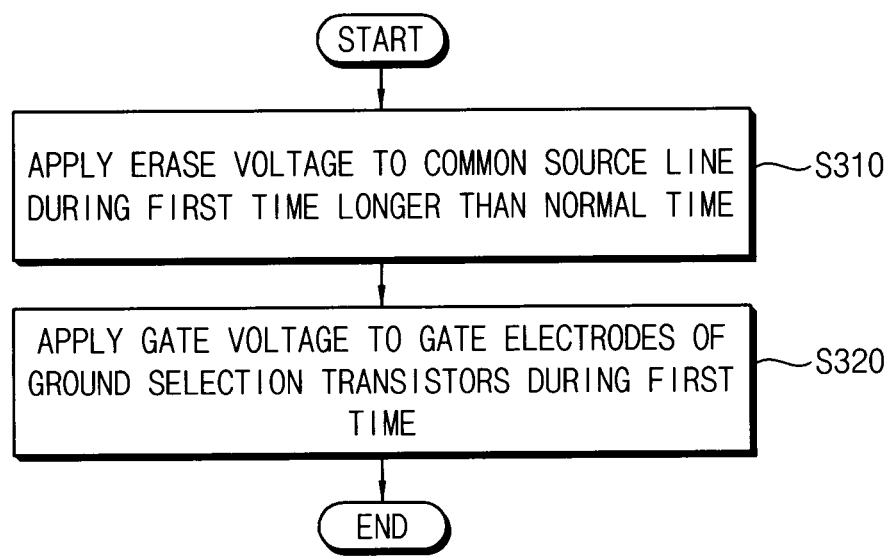
FIG. 26 is a flow chart illustrating an example of performing a data erase operation of FIG. 25.
Figure 27A:
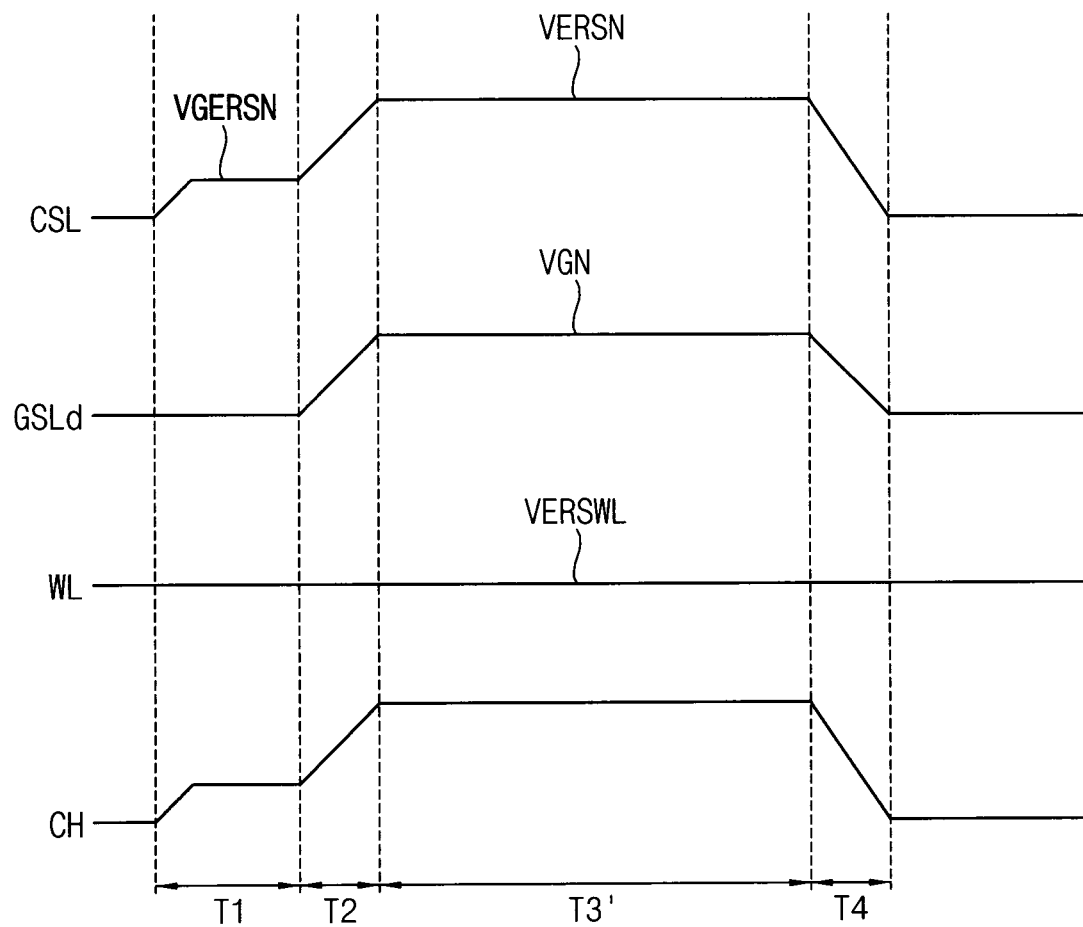
FIGS. 27A and 27B are diagrams for describing the data erase operation of FIG. 26.
Figure 27B:
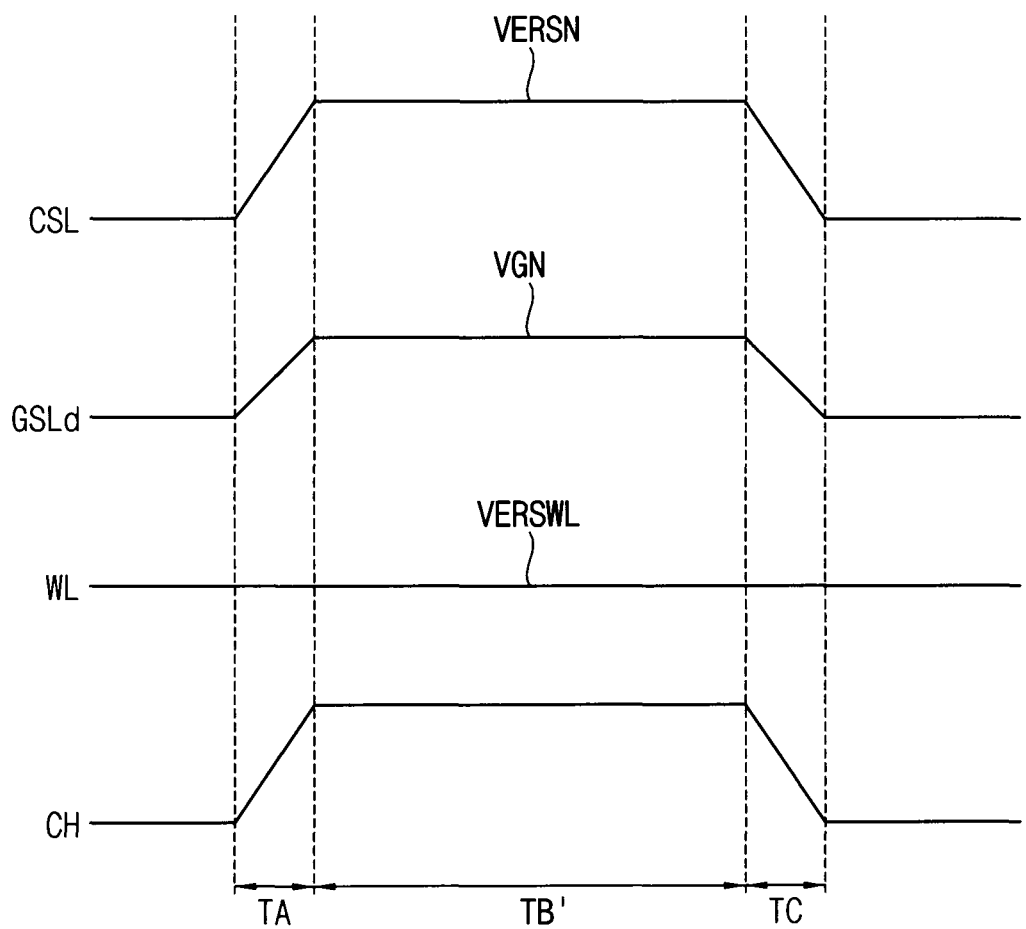

FIG. 26 is a flow chart illustrating an example of performing a data erase operation of FIG. 25. FIGS. 27A and 27B are diagrams for describing the data erase operation of FIG. 26. The descriptions repeated with FIGS. 8, 9A and 9B may be omitted.

Referring to FIGS. 7, 26, 27A and 27B, in performing the data erase operation, an erase voltage VERS may be applied to a common source line CSL of the memory block during first time longer than normal time (step S310). The normal time may correspond to the time interval T3 in FIG. 9A and the time interval TB in FIG. 9B, and the first time may correspond to a time interval T3' in FIG. 27A and a time interval TB' in FIG. 27B. Thus, the normal time may correspond to a time interval during which a level of the erase voltage VERS applied to the common source line CSL has the normal erase level VERSN. Thus, the normal time may correspond to a time interval during which the data erase operation is actually performed. While the erase voltage VERS is applied to the common source line CSL, a gate voltage may be applied to gate electrodes of the ground selection transistors that are directly connected to the common source line CSL and the lower ground selection line GSLd during the first time (step S320).

For example, a level of the erase voltage VERS applied to the common source line CSL may increase to a normal erase level VERSN via a normal GIDL erase level VGERSN as illustrated in FIG. 27A, or may increase directly to the normal erase level VERSN as illustrated in FIG. 27B. A level of the gate voltage applied to the lower ground selection line GSLd may increase to a normal gate level VGN.

In examples of FIGS. 26, 27A and 27B, the erase voltage VERS may be applied to the common source line CSL and the gate voltage may be applied to the gate electrodes of the ground selection transistors (e.g., the lower ground selection line GSLd) during the first time (e.g., T3' and TB' in FIGS. 27A and 27B) longer than the normal time (e.g., T3 and TB in FIGS. 9A and 9B). Thus, the amount of the GIDL current may increase and the data erase operation may be efficiently performed.

Figure 28:
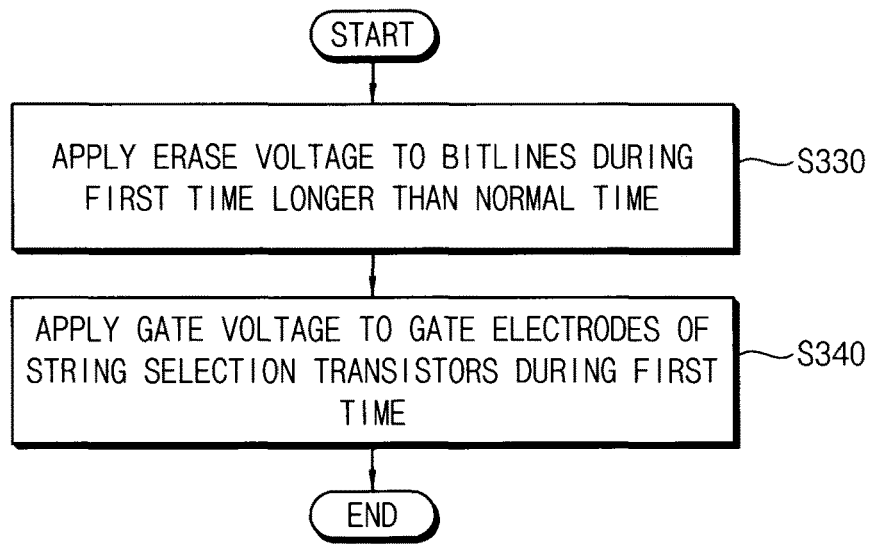
FIG. 28 is a flow chart illustrating another example of performing a data erase operation of FIG. 25.

FIG. 28 is a flow chart illustrating another example of performing a data erase operation of FIG. 25.

Referring to FIGS. 7 and 28, in performing the data erase operation, an erase voltage VERS may be applied to a bitline BL of the memory block during first time longer than normal time (step S330). The normal time may correspond to the time interval T3 and the time interval TB in FIGS. 9A and 9B, and the first time may correspond to a time interval T3' and a time interval TB' in FIGS. 27A and 27B. While the erase voltage VERS is applied to the bitline BL, a gate voltage may be applied to gate electrodes of the string selection transistors that are directly connected to the bitline BL and the upper string selection lines SSL0u~SSL3u during the first time (step S340).

An example of FIG. 28 may be substantially the same as an example of FIG. 25, except that the common source line CSL and the ground selection transistors in FIG. 25 are replaced with the bitline BL and the string selection transistors in FIG. 28.

Figure 29:
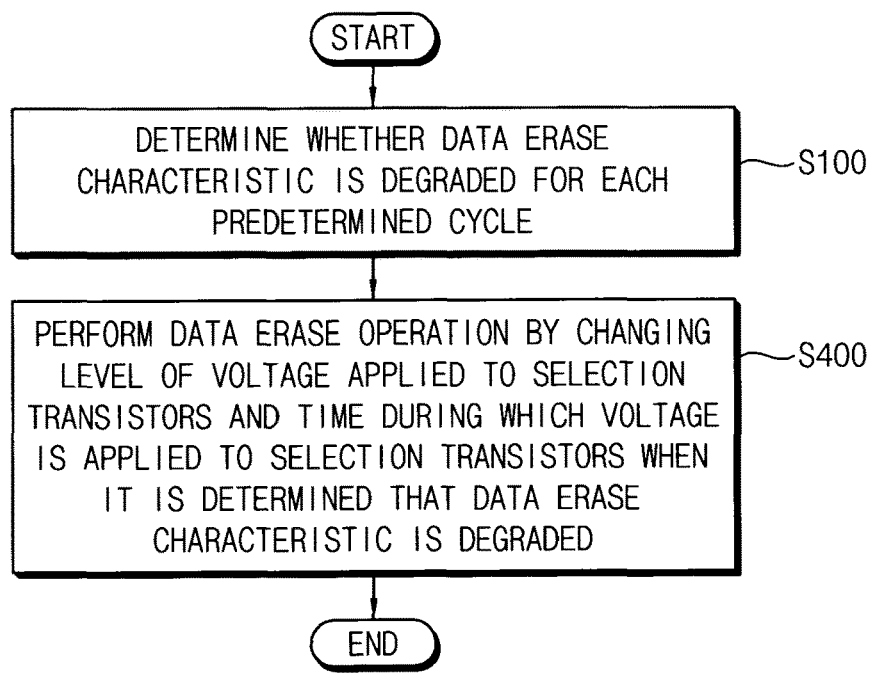
FIG. 29 is a flow chart illustrating a method of erasing data in a nonvolatile memory device according to example embodiments.

FIG. 29 is a flow chart illustrating a method of erasing data in a nonvolatile memory device according to example embodiments. The descriptions repeated with FIGS. 1 and 25 may be omitted.

Referring to FIG. 29, in a method of erasing data in a nonvolatile memory device according to example embodiments, it is determined whether a data erase characteristic for the memory block is degraded or not for each predetermined cycle (step S100). When it is determined that the data erase characteristic is degraded or deteriorated, a data erase operation is performed by changing a level of a voltage applied to selection transistors for selecting the memory block as an erase target block and by changing time during which the voltage is applied to the selection transistors together (step S400). An operation of changing the level of the voltage may be substantially the same as examples described with reference to FIGS. 1 and 7 through 16, and an operation of changing the time during which the voltage is applied may be substantially the same as examples described with reference to FIGS. 7 and 25 through 28.

As described above, when it is determined that the data erase characteristic is degraded, the data erase operation may be performed based on at least one of a first change operation and a second change operation. The first change operation may represent an operation of changing the level of the voltage applied to the selection transistors, and the second change operation may represent an operation of changing the time during which the voltage is applied to the selection transistors. Thus, the characteristic and reliability of the data erase operation may be improved or enhanced, and the nonvolatile memory device may have relatively extended lifetime.

Figure 30:
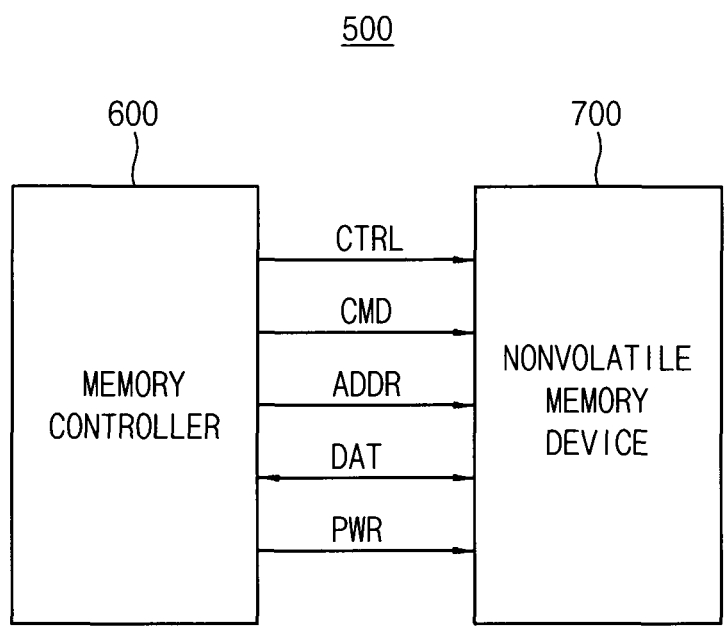
FIG. 30 is a block diagram illustrating a memory system that includes a nonvolatile memory device according to example embodiments.

FIG. 30 is a block diagram illustrating a memory system that includes a nonvolatile memory device according to example embodiments.

Referring to FIG. 30, a memory system 500 includes a memory controller 600 and at least one nonvolatile memory device 700.

The nonvolatile memory device 700 may correspond to the nonvolatile memory device according to example embodiments, and may perform data erase, program (or write) and/or read operations under control of the memory controller 600. For example, the nonvolatile memory device 700 may perform the method of erasing data according to example embodiments. The nonvolatile memory device 700 may receive a command CMD and an address ADDR through I/O lines from the memory controller 600 for performing such operations, and may exchange data DAT with the memory controller 600 for performing such program or read operation. In addition, the nonvolatile memory device 700 may receive a control signal CTRL through a control line from the memory controller 600. In addition, the nonvolatile memory device 700 receives a power PWR through a power line from the memory controller 600.

Figure 31:
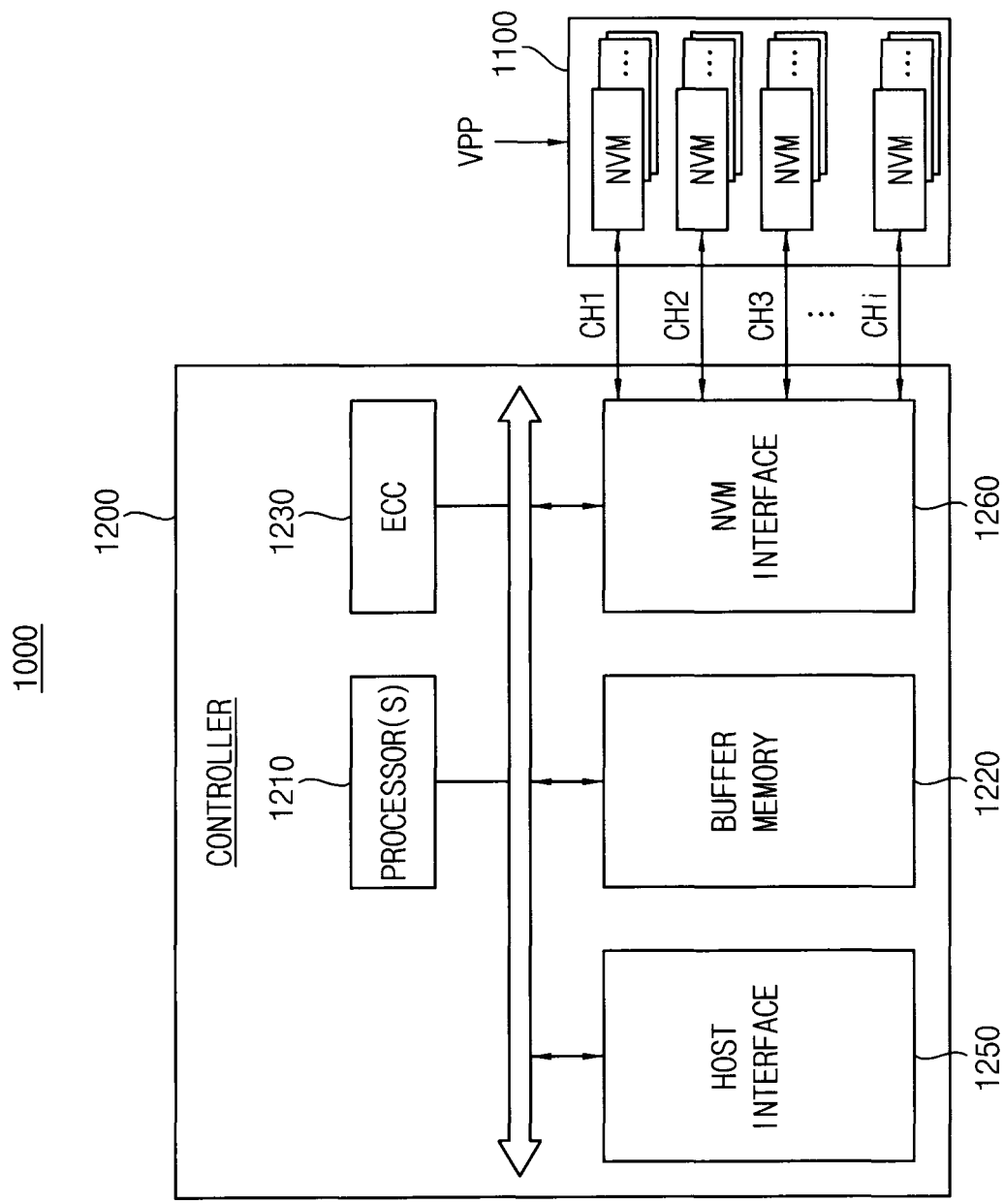
FIG. 31 is a block diagram illustrating a storage device that includes a nonvolatile memory device according to example embodiments.

FIG. 31 is a block diagram illustrating a storage device that includes a nonvolatile memory device according to example embodiments.

Referring to FIG. 31, a storage device 1000 includes a plurality of nonvolatile memory devices 1100 and a controller 1200. For example, the storage device 1000 may be any storage device such as an embedded multimedia card (eMMC), a universal flash storage (UFS), a solid state disc or solid state drive (SSD), etc.

The controller 1200 may be connected to the nonvolatile memory devices 1100 via a plurality of channels CH1, CH2, CH3 . . . CHi. The controller 1200 may include one or more processors 1210, a buffer memory 1220, an error correction code (ECC) circuit 1230, a host interface 1250 and a nonvolatile memory interface 1260.

The buffer memory 1220 may store data used to drive the controller 1200. The ECC circuit 1230 may calculate error correction code values of data to be programmed during a program operation, and may correct an error of read data using an error correction code value during a read operation. In a data recovery operation, the ECC circuit 1230 may correct an error of data recovered from the nonvolatile memory devices 1100. The host interface 1250 may provide an interface with an external device. The nonvolatile memory interface 1260 may provide an interface with the nonvolatile memory devices 1100.

Each of the nonvolatile memory devices 1100 may correspond to the nonvolatile memory device according to example embodiments, and may be optionally supplied with an external high voltage VPP from a voltage source (not shown) external to the nonvolatile memory devices 1100.

Figure 32:
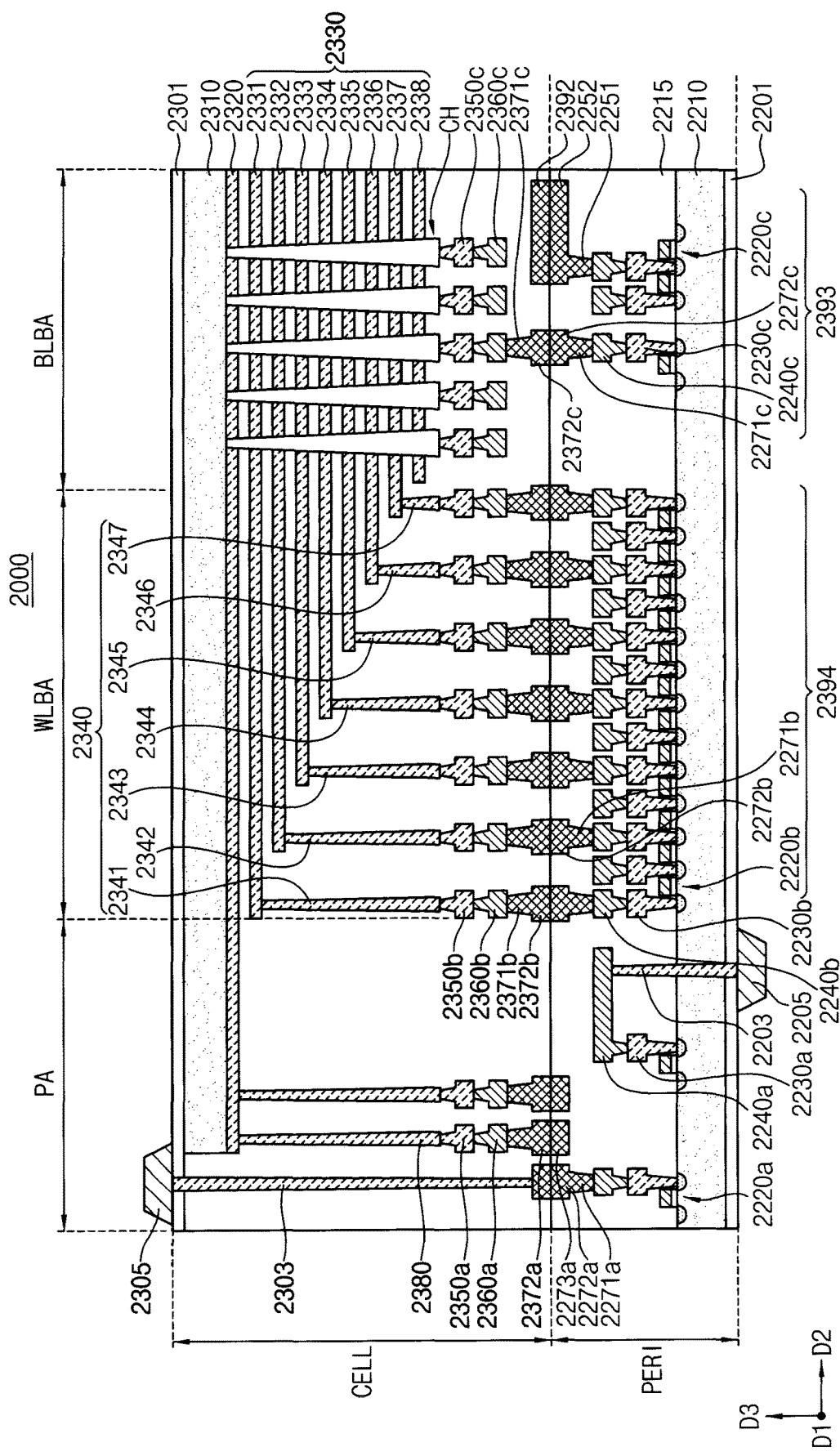
FIG. 32 is a cross-sectional view of a nonvolatile memory device according to example embodiments.

FIG. 32 is a cross-sectional view of a nonvolatile memory device according to example embodiments.

Referring to FIG. 32, a nonvolatile memory device or a memory device 2000 may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a copper-to-copper (Cu—Cu) bonding. The present invention is not limited thereto. In an example embodiment, the bonding metals may be formed of aluminum or tungsten.

Each of the peripheral circuit region PERI and the cell region CELL of the memory device 2000 may include an external pad bonding area PA, a wordline bonding area WLBA, and a bitline bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten, and the second metal layers 2240a, 2240b, and 2240c may be formed of copper. The resistivity of tungsten is lower than that of copper.

In an example embodiment illustrate in FIG. 32, although the first metal layers 2230a, 2230b, and 2230c and the second metal layers 2240a, 2240b, and 2240c are shown and described, they are not limited thereto, and one or more metal layers may be further formed on the second metal layers 2240a, 2240b, and 2240c. At least a portion of the one or more metal layers formed on the second metal layers 2240a, 2240b, and 2240c may be formed metal such as aluminum or the like. The metal of the one or more metal layers may have resistivity lower than that of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the wordline bonding area WLBA. In the wordline bonding area WLBA, the lower bonding metals 2271b and 2272b in the peripheral circuit region PERI may be electrically connected to upper bonding metals 2371b and 2372b in the cell region CELL in a bonding manner, and the lower bonding metals 2271b and 2272b and the upper bonding metals 2371b and 2372b may be formed of aluminum, copper, tungsten, or the like. Furthermore, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of wordlines 2331, 2332, 2333, 2334, 2335, 2336, 2337, and 2338 (i.e., 2330) may be stacked in a third direction D3, perpendicular to an upper surface of the second substrate 2310. At least one string selection line and at least one ground selection line may be arranged on and below the plurality of wordlines 2330, respectively, and the plurality of wordlines 2330 may be disposed between the at least one string selection line and the at least one ground selection line.

In the bitline bonding area BLBA, a channel structure CH may extend in the third direction D3, perpendicular to the upper surface of the second substrate 2310, and pass through the plurality of wordlines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bitline contact, and the second metal layer 2360c may be a bitline. In an example embodiment, the bitline 2360c may extend in a first direction D1, parallel to the upper surface of the second substrate 2310.

In an example embodiment illustrated in FIG. 32, an area in which the channel structure CH, the bitline 2360c, and the like are disposed may be defined as the bitline bonding area BLBA. In the bitline bonding area BLBA, the bitline 2360c may be electrically connected to the circuit elements 2220c of a page buffer 2393 in the peripheral circuit region PERI. For example, the bitline 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the wordline bonding area WLBA, the plurality of wordlines 2330 may extend in a second direction D2, parallel to the upper surface of the second substrate 2310, and may be connected to a plurality of cell contact plugs 2341, 2342, 2343, 2344, 2345, 2346, and 2347 (i.e., 2340). The plurality of wordlines 2330 and the plurality of cell contact plugs 2340 may be connected to each other in pads provided by at least a portion of the plurality of wordlines 2330 extending in different lengths in the second direction D2. A first metal layer 2350b and a second metal layer 2360b may be connected to an upper portion of the plurality of cell contact plugs 2340. The plurality of cell contact plugs 2340 may be connected to the plurality of wordlines 2330. The plurality of cell contact plugs 2340 may be connected to the circuit region PERI by the upper bonding metals 2371b and 2372b of the cell region CELL and the lower bonding metals 2271b and 2272b of the peripheral circuit region PERI in the wordline bonding area WLBA.

The plurality of cell contact plugs 2340 may be electrically connected to the circuit elements 2220b providing a row decoder 2394 in the peripheral circuit region PERI. In an example embodiment, operating voltages of the circuit elements 2220b of the row decoder 2394 may be different than operating voltages of the circuit elements 2220c of the page buffer 2393. For example, operating voltages of the circuit elements 2220c of the page buffer 2393 may be greater than operating voltages of the circuit elements 2220b providing the row decoder 2394.

A common source line contact plug 2380 may be disposed in the external pad bonding area PA. The common source line contact plug 2380 may be formed of a conductive material such as metal, a metal compound, polysilicon, or the like, and may be electrically connected to the common source line 2320. A first metal layer 2350a and a second metal layer 2360a may be stacked on an upper portion of the common source line contact plug 2380. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating film 2301. The second input/output pad 2305 may be connected to at least one of the plurality of circuit elements 2220a, 2220b, and 2220c disposed in the peripheral circuit region PERI through a second input/output contact plug 2303.

According to embodiments, the second substrate 2310 and the common source line 2320 are not disposed in an area in which the second input/output contact plug 2303 is disposed. Also, the second input/output pad 2305 does not overlap the wordlines 2330 in the third direction D3. The second input/output contact plug 2303 may be separated from the second substrate 2310 in the direction, parallel to the upper surface of the second substrate 310, and may pass through the interlayer insulating layer 2315 of the cell region CELL to be connected to the second input/output pad 2305.

According to embodiments, the first input/output pad 2205 and the second input/output pad 2305 may be selectively formed. For example, the memory device 2000 may include only the first input/output pad 2205 disposed on the first substrate 2210 or may include only the second input/output pad 2305 disposed on the second substrate 2310. Alternatively, the memory device 200 may include both the first input/output pad 2205 and the second input/output pad 2305.

A metal pattern in an uppermost metal layer may be provided as a dummy pattern or the uppermost metal layer may be absent, in each of the external pad bonding area PA and the bitline bonding area BLBA, respectively included in the cell region CELL and the peripheral circuit region PERI.

In the external pad bonding area PA, the memory device 2000 may include a lower metal pattern 2273a in an uppermost metal layer of the peripheral circuit region PERI. The lower metal pattern 2273a may correspond to an upper metal pattern 2372a formed in an uppermost metal layer of the cell region CELL, and may have the same shape as the upper metal pattern 2372a of the cell region CELL which is an uppermost metal layer of the cell region CEL. In the peripheral circuit region PERI, the lower metal pattern 2273a formed in the uppermost metal layer of the peripheral circuit region PERI is not connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 2271b and 2272b may be formed on the second metal layer 2240b in the wordline bonding area WLBA. In the wordline bonding area WLBA, the lower bonding metals 2271b and 2272b of the peripheral circuit region PERI may be electrically connected to the upper bonding metals 2371b and 2372b of the cell region CELL by a Cu—Cu bonding.

Furthermore, the bitline bonding area BLBA, an upper metal pattern 2392, corresponding to a lower metal pattern 2252 formed in the uppermost metal layer of the peripheral circuit region PERI, and having the same shape as the lower metal pattern 2252 of the peripheral circuit region PERI, may be formed in an uppermost metal layer of the cell region CELL. A contact is not formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact is not be formed on the reinforcement metal pattern.

The method of erasing data according to example embodiments may be applied or employed to the memory device 2000, and the memory device 2000 may be implemented to perform the method of erasing data according to example embodiments. For example, the erase voltage, the erase verification voltage, and related signals used to perform the method of erasing data according to example embodiments may be applied through the illustrated bonding structure.

The inventive concept may be applied to various devices and systems that include a nonvolatile memory device. For example, the inventive concept may be applied to systems such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A nonvolatile memory device comprising:
    a memory block including a plurality of memory strings; and
    a control circuit configured to control the memory block,
    wherein each memory string includes:
        a plurality of memory cells connected in series, stacked in a vertical direction relative to an underlying substrate, and connected to a plurality of wordlines;
        two or more ground selection transistors connecting a first end of each memory string to a common source line, and connected to two or more ground selection lines; and
        two or more string selection transistors connecting a second end, opposite the first end, of each memory string to a bitline, and connected to two or more string selection lines, and
    wherein the control circuit is configured to perform a data erase operation on the memory block by:
    applying an erase voltage having a first erase level higher than a normal erase level to the common source line; and
    applying a gate voltage having a first gate level lower than a normal gate level to one of the two or more ground selection lines.

2. The nonvolatile memory device of claim 1, wherein:
    the two or more ground selection transistors include a first ground selection transistor and a second ground selection transistor, and the two or more ground selection lines include a first ground selection line and a second ground selection line,
    the first ground selection transistor is connected between the plurality of memory cells and the second ground selection transistor, and the first ground selection line is connected to a gate electrode of the first ground selection transistor, the second ground selection transistor is connected between the first ground selection transistor and the common source line, and the second ground selection line is connected to a gate electrode of the second ground selection transistor, and the gate voltage is applied to the second ground selection line.

3. The nonvolatile memory device of claim 1, wherein:

the erase voltage having the first erase level is applied to the common source line during a first time longer than a normal time, and the gate voltage having the first gate level is applied to one of the two or more ground selection lines during the first time.

4. The nonvolatile memory device of claim 1, wherein:

during a first time interval during which a number of program/erase (P/E) cycles is less than a first number, a voltage difference between the erase voltage and the gate voltage corresponds to a first voltage, and during a second time interval after the first time interval during which the number of P/E cycles is greater than or equal to the first number, the voltage difference between the erase voltage and the gate voltage corresponds to a second voltage greater than the first voltage.

5. The nonvolatile memory device of claim 1, wherein:

the memory block is included in a memory cell region including a first metal pad, the control circuit is a peripheral circuit region including a second metal pad, and the peripheral circuit region is vertically connected to the memory cell region by the first metal pad and the second metal pad.

6. The nonvolatile memory device of claim 5, wherein the first metal pad and the second metal pad are formed of copper.

7. The nonvolatile memory device of claim 5, wherein the first metal pad and the second metal pad are connected by bonding manner.

8. The nonvolatile memory device of claim 5, wherein the memory cell region is formed on a first wafer and the peripheral circuit region is formed on a second wafer.

9. The nonvolatile memory device of claim 1, wherein the control circuit is configured to:

determine whether a data erase characteristic for the memory block is degraded for each predetermined cycle of the data erase operation, and perform the data erase operation in response to determining that the data erase characteristic is degraded.

10. The nonvolatile memory device of claim 9, wherein the control circuit is configured to determine whether the data erase characteristic is degraded by:

measuring a distribution of threshold voltages of the two or more ground selection transistors;

counting at least one of a number of first ground selection transistors and a number of second ground selection transistors among the two or more ground selection transistors, threshold voltages of the first ground selection transistors being sensed lower than a first reference voltage, threshold voltages of the second ground selection transistors being sensed higher than a second reference voltage; and determining a degree of degradation of the data erase characteristic based on at least one of the number of the first ground selection transistors and the number of the second ground selection transistors.

11. The nonvolatile memory device of claim 9, wherein the control circuit is configured to determine whether the data erase characteristic is degraded by:

measuring a distribution of threshold voltages of erase memory cells among the plurality of memory cells, the erase memory cells having an erase state;

counting at least one of a number of first erase memory cells and a number of second erase memory cells among the erase memory cells, threshold voltages of the first erase memory cells being sensed higher than a first reference voltage, threshold voltages of the second erase memory cells being sensed lower than a second reference voltage; and determining a degree of degradation of the data erase characteristic based on at least one of the number of the first erase memory cells and the number of the second erase memory cells.

12. The nonvolatile memory device of claim 9, wherein each predetermined cycle for determining whether the data erase characteristic is degraded is associated with a number of cycles of the data erase operation.

13. A nonvolatile memory device comprising:

a memory block including a plurality of memory strings; and a control circuit configured to control the memory block, wherein each memory string includes:

a plurality of memory cells connected in series, stacked in a vertical direction relative to an underlying substrate, and connected to a plurality of wordlines;

two or more ground selection transistors connecting a first end of each memory string to a common source line, and connected to two or more ground selection lines; and two or more string selection transistors connecting a second end, opposite the first end, of each memory string to a bitline, and connected to two or more string selection lines, and wherein the control circuit is configured to perform a data erase operation on the memory block by:

applying an erase voltage having a normal erase level to the common source line; and applying a gate voltage having a first gate level lower than a normal gate level to one of the two or more ground selection lines.

14. The nonvolatile memory device of claim 13, wherein:

the two or more ground selection transistors include a first ground selection transistor and a second ground selection transistor, and the two or more ground selection lines include a first ground selection line and a second ground selection line, the first ground selection transistor is connected between the plurality of memory cells and the second ground selection transistor, and the first ground selection line is connected to a gate electrode of the first ground selection transistor, the second ground selection transistor is connected between the first ground selection transistor and the common source line, and the second ground selection line is connected to a gate electrode of the second ground selection transistor, and the gate voltage is applied to the second ground selection line.

15. The nonvolatile memory device of claim 13, wherein:
the erase voltage having a first erase level is applied to the common source line during a first time longer than a normal time, and
the gate voltage having the first gate level is applied to one of the two or more ground selection lines during the first time.

16. The nonvolatile memory device of claim 13, wherein:
during a first time interval during which a number of program/erase (P/E) cycles is less than a first number, a voltage difference between the erase voltage and the gate voltage corresponds to a first voltage, and
during a second time interval after the first time interval during which the number of P/E cycles is greater than or equal to the first number, the voltage difference between the erase voltage and the gate voltage corresponds to a second voltage greater than the first voltage.

17. A nonvolatile memory device comprising:
a memory block including a plurality of memory strings; and
a control circuit configured to control the memory block, wherein each memory string includes:
   a plurality of memory cells connected in series, stacked in a vertical direction relative to an underlying substrate, and connected to a plurality of wordlines;
   two or more ground selection transistors connecting a first end of each memory string to a common source line, and connected to two or more ground selection lines; and
   two or more string selection transistors connecting a second end, opposite the first end, of each memory string to a bitline, and connected to two or more string selection lines, and
wherein the control circuit is configured to perform a data erase operation on the memory block by:
   applying an erase voltage having a first erase level higher than a normal erase level to the common source line; and
   applying a gate voltage having a normal gate level to one of the two or more ground selection lines.

18. The nonvolatile memory device of claim 17, wherein:
the two or more ground selection transistors include a first ground selection transistor and a second ground selection transistor, and the two or more ground selection lines include a first ground selection line and a second ground selection line,
the first ground selection transistor is connected between the plurality of memory cells and the second ground selection transistor, and the first ground selection line is connected to a gate electrode of the first ground selection transistor,
the second ground selection transistor is connected between the first ground selection transistor and the common source line, and the second ground selection line is connected to a gate electrode of the second ground selection transistor, and
the gate voltage is applied to the second ground selection line.

19. The nonvolatile memory device of claim 17, wherein:
the erase voltage having the first erase level is applied to the common source line during a first time longer than a normal time, and
the gate voltage having a first gate level is applied to one of the two or more ground selection lines during the first time.

20. The nonvolatile memory device of claim 17, wherein:
during a first time interval during which a number of program/erase (P/E) cycles is less than a first number, a voltage difference between the erase voltage and the gate voltage corresponds to a first voltage, and
during a second time interval after the first time interval during which the number of P/E cycles is greater than or equal to the first number, the voltage difference between the erase voltage and the gate voltage corresponds to a second voltage greater than the first voltage.

\* \* \* \* \*